(12) United States Patent
Ramachandra et al.

(10) Patent No.: US 12,100,458 B2
(45) Date of Patent: Sep. 24, 2024

(54) SYSTEMS AND METHODS OF CORRECTING ERRORS IN UNMATCHED MEMORY DEVICES

(71) Applicant: SanDisk Technologies LLC, Addison, TX (US)

(72) Inventors: Venkatesh Prasad Ramachandra, San Jose, CA (US); Jang Woo Lee, San Ramon, CA (US); Srinivas Rajendra, San Jose, CA (US); Anil Pai, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 85 days.

(21) Appl. No.: 17/827,562

(22) Filed: May 27, 2022

(65) Prior Publication Data

US 2023/0386584 A1 Nov. 30, 2023

(51) Int. Cl.
*G11C 16/32* (2006.01)
(52) U.S. Cl.
CPC .................................. *G11C 16/32* (2013.01)
(58) Field of Classification Search
CPC ......... G11C 7/22; G11C 16/10; G11C 29/023; G11C 29/028; G06F 13/1689
USPC ....................................... 365/185.18, 230.03
See application file for complete search history.

(56) References Cited

U.S. PATENT DOCUMENTS

| | | | | |
|---|---|---|---|---|
| 10,601,410 B1 * | 3/2020 | Satoh | ..................... | H03K 3/017 |
| 2006/0047450 A1 * | 3/2006 | Tabatabaei | ....... | G01R 31/31709 |
| | | | | 702/69 |
| 2006/0149982 A1 * | 7/2006 | Vogt | ..................... | G11C 29/028 |
| | | | | 713/320 |
| 2007/0271052 A1 * | 11/2007 | Abel | .................... | H03K 5/1565 |
| | | | | 702/79 |
| 2012/0087194 A1 * | 4/2012 | Oh | .......................... | G11C 7/22 |
| | | | | 365/189.16 |
| 2018/0074096 A1 * | 3/2018 | Absher | ................. | G01R 13/02 |
| 2019/0334508 A1 * | 10/2019 | Tang | ..................... | H03K 3/017 |
| 2020/0412352 A1 * | 12/2020 | Marko | ................... | G11C 16/32 |
| 2023/0386600 A1 * | 11/2023 | Lee | ...................... | G11C 29/028 |

FOREIGN PATENT DOCUMENTS

| | | | | | |
|---|---|---|---|---|---|
| CN | 110021310 A | * | 7/2019 | ......... | G06F 13/1689 |
| CN | 110110931 A | * | 8/2019 | | |
| CN | 113568848 A | * | 10/2021 | ......... | G06F 13/1668 |

(Continued)

*Primary Examiner* — Michael T Tran

(74) *Attorney, Agent, or Firm* — Sheppard, Mullin Richter & Hampton LLP

(57) ABSTRACT

Systems and methods are provided for correcting errors in unmatched memory devices. Various embodiments herein train a memory interface to determine a duty cycle timing for a clock signal in a data window formed by a data signal in a memory cell. The duty cycle timing identifies an initial trained timing in the data window at which a setup portion and a hold portion of the data window are approximately equal in length when the trigger signal is received at the initial trained timing. The embodiments herein also identify an event that shifts the duty cycle timing away from the initial trained timing, and triggers a retraining of the memory interface based on a determination that at least one of two points defined about the initial trained timing fails a two-point sampling.

20 Claims, 13 Drawing Sheets

(56) References Cited

FOREIGN PATENT DOCUMENTS

| CN | 114199258 A | * | 3/2022 | ............. G01S 19/11 |
| CN | 111611488 B | * | 9/2022 | ......... G06F 16/9535 |
| JP | 3705119 B2 | * | 10/2005 | |

* cited by examiner

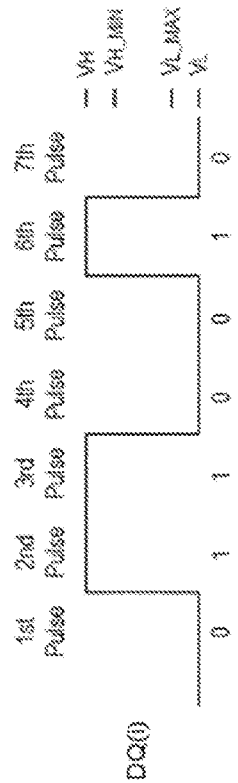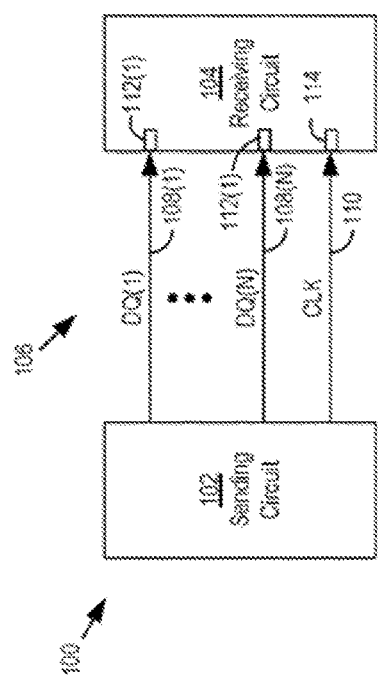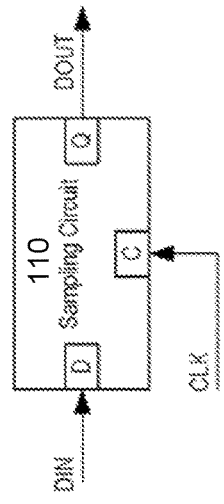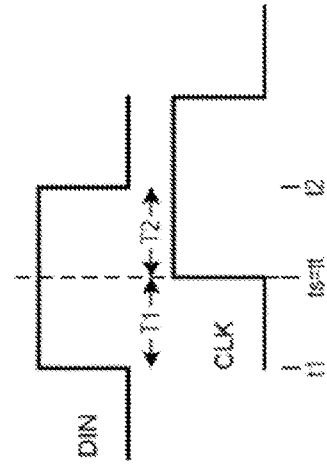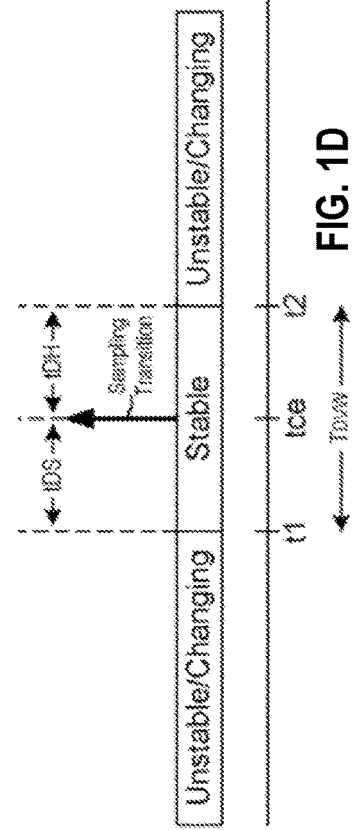
FIG. 1A
FIG. 1B
FIG. 1C
FIG. 1D
FIG. 1E

510 ⤴

| Function | Register Type | Operand | Data | Comment |
|---|---|---|---|---|
| DQS Oscillator Count | Read Only | (TBD) | DQS Oscillator Count Value | Adopt Concepts from LPDDR4 |
| Initialization and Training Modes | | | Setting Values: Stop DQS Oscillator<br>Setting Values: Start DQS Oscillator | |

520 ⤴

| Symbol | Parameter | Min | Max | Unit | Comment |
|---|---|---|---|---|---|
| tDQS2DQ_temp | DQ to DQS Offset Temperature Variation | - | (TBD) | ps/°C | Adopt Concepts from LPDDR4 |
| tDQS2DQ_volt | DQ to DQS Offset Voltage Variation | - | (TBD) | (TBD) | |
| OSC$_{Match}$ | DQS Oscillator Matching Error | (TBD) | (TBD) | ps | |
| OSC$_{offset}$ | DQS Oscillator Offset | (TBD) | (TBD) | ps | |
| tOSCO | Delay Time from OSC Stop to Readout | (TBD) | - | ns | |

FIG. 5

SYSTEMS AND METHODS OF CORRECTING ERRORS IN UNMATCHED MEMORY DEVICES

DESCRIPTION OF RELATED ART

Semiconductor memory is widely used in various electronic devices, such as cellular telephones, digital cameras, personal digital assistants, medical electronics, mobile and non-mobile computing devices, vehicles, and so forth. Such semiconductor memory may comprise non-volatile memory and/or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

As non-volatile memory technologies advance, margins of error for performing various operations, such as read, write, and similar operations, decrease. For example, during a write operation, a controller associated with the non-volatile memory writes data to a non-volatile memory cell during a data interval defined by a left edge and a right edge of a data signal pulse associated with the non-volatile memory cell. Data operations on the data interval may occur in relation to a duty cycle pulse. In some instances, process, voltage, and/or temperature (PVT) variations in the non-volatile memory or in a clock path may introduce distortion into one or more of the data interval or the duty cycle pulse, thereby causing the data operations to be less successful or fail.

BRIEF DESCRIPTION OF THE DRAWINGS

The present disclosure, in accordance with one or more various embodiments, is described in detail with reference to the following figures. The figures are provided for purposes of illustration only and merely depict typical or example embodiments.

FIG. 1A is a block diagram of an example system that includes a sending circuit and a receiving circuit.

FIG. 1B is an example timing diagram of a data signal.

FIG. 1C is a block diagram of an example sampling circuit.

FIG. 1D is a schematic diagram of setup and hold time requirements of the sampling circuit of FIG. 1C.

FIG. 1E is a timing diagram of a sampling transition of a data strobe signal in a target sampling position.

FIG. 5 depicts example tables of functions for detecting a delay between a data strobe signal and data signal using the clock interval oscillator circuit of FIG. 3.

Figure 2A:
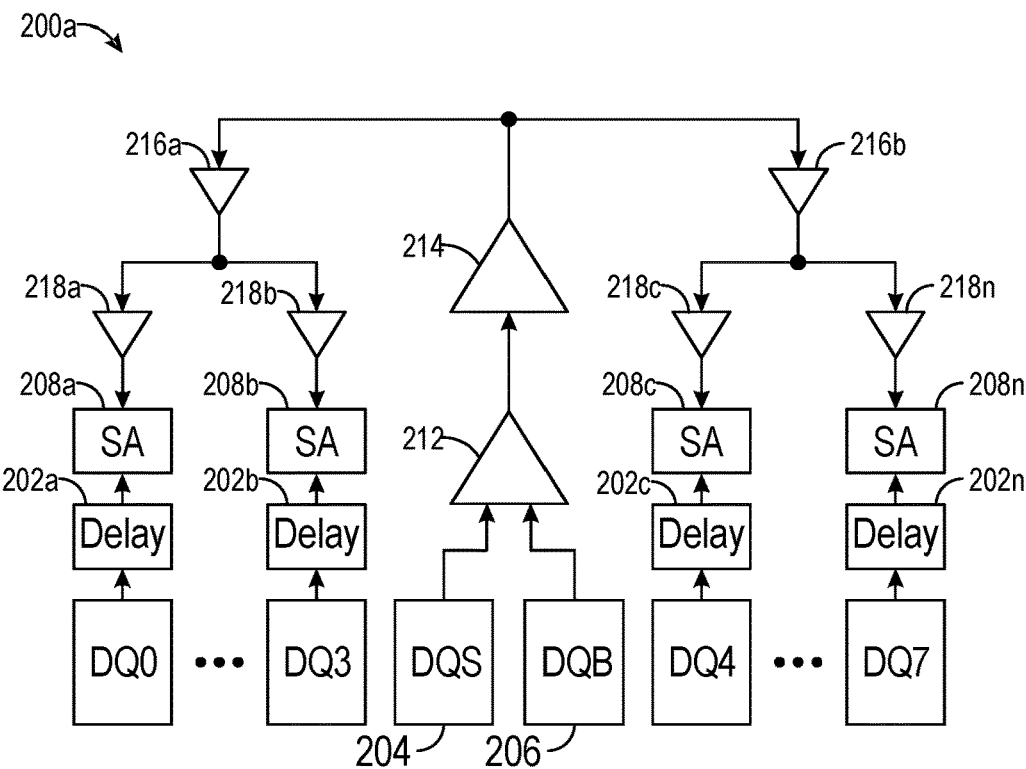
FIG. 2A is an example of a matched data signal to data strobe signal architecture.

The figures are not exhaustive and do not limit the present disclosure to the precise form disclosed.

DETAILED DESCRIPTION

Computing systems often employ NAND-type flash memories (also referred to herein as flash memories) for short and/or long-term storage of data. The flash memories may include a flash memory controller (referred to herein as a controller) and a flash memory die (referred to herein as a memory die). The flash memories may employ a clock signal (also referred to as a data strobe signal) or a pair of complementary clock signals between the controller and the memory die to coordinate data reads from and writes to the memory die (e.g., data operations). For example, in response to a received clock signal and a corresponding data signal from the controller, the memory die writes the corresponding data to memory cells of the memory die. The memory die may read data from the memory cells and align a corresponding output data signal with a clock signal from the memory die for transmission to the controller for processing.

FIG. 1A shows one embodiment of a system 100 in which the embodiments disclosed herein may be implemented. The system 100 includes a sending circuit 102 and a receiving circuit 104 configured to communicate with each other via a communications bus 106. Both the sending circuit 102 and the receiver circuit 104 may be transceiver circuits, which can be configured to transmit and receive signals. For simplicity, with reference to FIG. 1A, one of the circuits 102 is designated as the sending circuit 102 and the other circuit 104 is designated as the receiving circuit 104.

Additionally, in particular example configurations, each of the sending circuit 102 and the receiving circuit 104 are integrated circuits (IC). In general, an integrated circuit (IC)—also referred to as a monolithic IC, a chip, or a microchip—is an assembly or a collection of electric circuit components (including active components, such as transistors and diodes, and passive components, such as capacitors and resistors) and their interconnections formed as a single unit, such as by being fabricated, on a substrate typically made of a semiconductor material such as silicon. For such embodiments, the sending circuit 102 and the receiving circuit 104 are separate integrated circuits, and the communication bus 106 is configured to communicate signals external to the separate sending circuit (IC) 102 and the receiving circuit (IC) 104.

The sending circuit 102 is configured to send a clock signal CLK (also referred to herein as a data strobe signal DQS) and a plurality of data signals DQ to the receiving circuit 104 via a communications bus 106. Otherwise stated, the receiving circuit 104 is configured to receive a clock signal CLK and a plurality of data signals DQ from the sending circuit 102 via the communications bus 106. The plurality of data signals DQ are shown in FIG. 1A as including data signals DQ(1) to DQ(N), where N is two or more. For particular example configurations, N is 8, although other integer numbers of two or more may be possible for other example configurations.

From the perspective of the sending circuit 102, the clock signal CLK is an output clock signal, and the data signals DQ are output data signals in that they are the clock and data signals that the sending circuit 102 outputs to the receiving circuit 104. From the perspective of the receiving circuit 104, the clock signal CLK is an input clock signal, and the data signals DQ are input data signals in that they are the clock and data signals that the receiving circuit 104 receives from the sending circuit 102.

The communications bus 106 includes data lines 108(1) to 108(N) between the sending circuit 102 and the clock circuit 104. The receiving circuit has data input contacts 112(1) to 112(N), which are in physical and electrical contact with the respective data lines 108(1) to 108(N). The data input contacts 112(1) to 112(N) could be pins, pads, etc. The sending circuit 102 is configured to send the data signals DQ(1) to DQ(N) simultaneously and/or in parallel over the data lines 108(1) to 108(N) to the receiving circuit 104. Otherwise stated, the receiving circuit 104 is configured to receive the data signals DQ(1) to DQ(N) simultaneously and/or in parallel from over the data lines 108(1) to 108(N).

In addition, the communications bus 106 includes one or more clock lines 110 between the sending circuit 102 and the receiving circuit 104. The receiving circuit has one or more clock input contacts 114, which is/are in physical and electrical contact with the respective one or more clock lines 110. The clock input contact(s) could be pins, pads, etc. As described in further detail below, the input clock signal CLK may include a single-ended clock signal or a pair of complementary clock signals (e.g., DQS and DQSB, where DQSB is the logical inverse of DQS). Where the input clock signal CLK is a single-ended clock signal, the one or more clock lines 110 may include a single clock line. Where the input clock signal CLK is a pair of complementary clock signals DQS, DQSB, the one or more clock lines 110 may include two clock lines. The sending circuit 102 may be configured to transmit each clock signal DQS, DQSB of the complementary pair over a respective one of the two clock lines 110. The receiving circuit 104 is configured to receive the input clock signal CLK—either as a single-ended clock signal or as a pair of complementary clock signals—simultaneously and/or in parallel with the input of data signals DQ(1) to DQ(N).

The sending circuit 102 and the receiving circuit 104 form a source system 100, which may be synchronous or asynchronous. A source synchronous system is a system in which a source circuit sends a data signal along with a clock signal to a destination circuit in order for the destination circuit to use the clock signal to identify the data values of the data signal. In the system 100, the sending circuit 102 is the source circuit, and the receiving circuit 104 is the destination circuit. However, as transceiver circuits, the sending circuit 102 and the receiving circuit 104 may change roles. For example, in certain operations, circuit 104 sends a clock signal and a data signal to circuit 102, and circuit 102 uses the clock signal to identify the data values of the data signal. For such operations, the circuit 104 becomes the sending or the source circuit, and the circuit 102 becomes the receiving or the destination circuit.

In general, a signal, such as the input clock signal CLK and the input data signals DQ may be at a level at a given point in time. As used herein, a level of a signal is a magnitude value, such as a voltage magnitude value or a current magnitude value. In some cases, the signal may be referred to as being at a high level or at a low level, transitioning between a high level and a low level, or transitioning between a low level and a high level. A high level of a signal may be a single high level, a level that is within a set or range of high levels, a maximum high level or a minimum high level of a set or range of high levels, or an average high level of a set or range of high levels. Similarly, a low level of a signal may be a single low level, a level that is within a set or range of low levels, a maximum low level or a minimum low level of a set or range of low levels, or an average low level of a set or range of low levels.

With reference to FIG. 1B, a high level of a signal is a level that is at or above a minimum high level $V_{H\_MIN}$, and a low level of the signal is a level that is at or below a maximum low level $V_{L\_MAX}$. The minimum high level $V_{H\_MIN}$ and the maximum low level $V_{L\_MAX}$ may be predetermined levels or values, and in particular example configurations, predetermined levels or values specified as part of a swing requirement with which the source circuit 102 is configured to comply when transmitting the signal. A signal that transitions according to and/or in compliance with the swing requirement transitions to a high level that is at or above the minimum high level $V_{H\_MIN}$ of the swing requirement, and transitions to a low level that is at or below the maximum low level $V_{L\_MAX}$ of the swing requirement.

In general, a signal performs transitions between its high level and its low level. A given transition of a signal may be one of two transition types, including a rising transition and a falling transition. A signal performs a rising transition when the signal transitions from its low level to its high level, and performs a falling transition when the signal transitions from its high level to its low level.

A portion of a magnitude waveform of a signal over a transition is referred to as an edge. In particular, a portion of the magnitude waveform over a rising transition is a rising edge and a portion of the magnitude waveform over a falling transition is a falling edge.

Also, a clock signal, such as the input clock signal CLK, is a signal that has repetitive cycles occurring over successive periods T. Within a cycle, one of the portions is at a high level and the other portion is at a low level. Accordingly, the portions may be defined by consecutive rising and falling transitions or edges of the clock signal. For example, a given rising edge or a given falling edge may define or mark a boundary when one portion ends and a next portion, either of the same cycle or of a next cycle, begins.

In addition, a clock signal may include clock pulses that are formed or defined by the rising and falling edges of the clock signal. In particular example configurations, the clock pulses of a clock signal correspond to the high level of the clock signal, in that each clock pulse is defined by a rising edge followed by a period where the clock signal is at its high level, and then followed by a falling edge. A pulse width of a given clock pulse is a time duration extending from a time that the magnitude of the rising edge of the clock pulse is at or rises to a predetermined level (e.g., 50% of the high level) to a time that the magnitude of the falling edge of the clock pulse is at or falls to the predetermined level. The clock pulses of the clock signal may occur according to the frequency of the clock signal.

Additionally, a data signal is a signal that carries and/or includes data. The data carried by and/or included in a data signal includes a bit sequence of bits, where each bit includes or has a single-bit logic value of "1" or "0". The data signal may include a series or sequence of data pulses corresponding to a bit sequence of the data. Each data pulse may be at a level that indicates a data value, otherwise referred to as a logic level or a logic value. In addition, each data value is represented by a binary number or a binary value that includes one or more digits corresponding to and/or representing the one or more bits of the bit sequence. A duration of a data pulse is an amount of time that the level of the data pulse indicates the data value that the data pulse represents.

FIG. 1B shows a timing diagram of magnitude waveform of a portion of an example $i^{th}$ data signal DQ(i) representative of one of the input data signals DQ(1) to DQ(N). For purposes of illustration, the $i^{th}$ data signal DQ(i) shown in FIG. 1B includes seven data pulses. Each data pulse is shown as being either at a high level at or above a minimum high level $V_{H\_MIN}$ or at a low level at or below a maximum low level $V_{L\_MAX}$. For the example data signal DQ(i) in FIG. 1B, the high level and the low level each indicate a single-bit logic value of "1" or "0", where the high level corresponds to and/or indicates a single-bit logic value of "1" (otherwise referred to as a logic 1 value) and the low level corresponds to and/or indicates a single-bit logic value of "0" (otherwise referred to as a logic 0 value). Other example data signals where different levels of the magnitude waveform correspond to and/or indicate multi-bit logic values (e.g., logic values that each include two or more digits or bits) may be possible.

For two consecutive data pulses of the $i^{th}$ data signal DQ(i), where the two consecutive pulses correspond to different logic levels, the data signal DQ(i) performs a rising transition or a falling transition to transition between the two consecutive data pulses. For the example shown in FIG. 1B, where one pulse in the sequence indicates a logic 0 value and a next pulse in the sequence indicates a logic 1 value, the $i^{th}$ data signal DQ(i) performs a rising transition to transition between the first and second pulses. On the other hand, where one pulse corresponds to a logic 1 value and a next pulse indicates a logic 0 value, the $i^{th}$ data signal DQ(i) performs a falling transition to transition between the first and second pulses. In addition, where two consecutive pulses indicate the same logic level, then as the pulse sequence transitions from the first data pulse to the next data pulse, the level of the $i^{th}$ data signal DQ(i) stays the same during those two pulses, and a rising transition or a falling transition may not occur. Regardless of whether a change in level of the $i^{th}$ data signal DQ(i) occurs when transitioning between two consecutive data pulses, the start of a given data pulse is referred to as a starting transition of the data pulse, and the end of a given data pulse is referred to as an ending transition of the data pulse.

In some embodiments, the receiving circuit 104 might possibly invert the data signal as the data signal is being processed. In one embodiment, the receiving circuit 104 inverts the data signal by passing the data signal through an odd number of inverters. Inverting the data signal causes the low voltage pulses of the data signal to be high voltage pulses, and causes the high voltage pulses of the data signal to be low voltage pulses. Also, inverting the data signal causes a "0" to be a "1", and likewise causes a "1" to be a "0".

Referring again to FIG. 1A, the receiving circuit 104 may include sampling circuitry that performs sampling actions to identify data values of data carried by the input data signals DQ. As used herein, a sampling action is an action performed to determine, identify, detect, capture, obtain, or latch onto, a level or magnitude of a signal at a given point in time. A circuit that performs sampling actions is referred to as a sampling circuit, and the signal on which the sampling circuit performs a sampling action is referred to as an input signal of the sampling circuit. A sampling circuit performing a sampling action on an input signal may include an input terminal configured to receive the input signal. In addition, a sampling circuit performing a sampling action may output or present the level of the input signal that it identifies. The sampling circuit may do so by generating an output signal at an output terminal of the sampling circuit at a level that indicates or corresponds to the level of the input signal that the sampling circuit identifies at its input terminal. Accordingly, a sampling circuit samples an input signal, samples a level of the input signal, or performs a sampling action on an input signal by identifying a level of an input signal and outputting an output signal at a level indicating the level of the input signal that it identifies.

In particular example configurations, the sampling circuit generates its output signal at a level that matches, directly corresponds to, or is equal in value to the level of the input signal that it identifies. For example, if the sampling circuit identifies its input signal at a low level, then the sampling circuit performs a sampling action by generating its output signal at its output terminal at a low level, and if the sampling circuit identifies its input signal at a high level, then the sampling circuit performs a sampling action by generating its output signal at its output terminal at a high level.

In addition, a sampling circuit performs sampling actions in response to detecting a transition in a clock. The clock transition may be a rising transition or a falling transition, although in some embodiments, sampling transitions may include both rising transitions and falling transitions. Each time a sampling circuit detects a clock transition, the sampling circuit samples the input signal. The input signal that a sampling circuit samples is referred to as its input data signal, and the output signal that a sampling circuit generates and outputs in response to performing sampling actions on the input signal is referred to as its output data signal.

The sampling circuitry of the receiver circuit 104 may include a separate sampling circuit for each input data signal D1(1) to DQ(N). Each of the sampling circuits is configured to sample the levels of a respective one of the data signals DQ(1) to DQ(N). An example sampling circuit is a flip flop, such a D flip flop for example.

FIG. 1C is a block diagram of an example sampling circuit 110, such as a flip flop or a latch. The sampling circuit 110 includes a data input terminal or node D, a data output terminal or node Q, and a clock input terminal or node C. The data input terminal D is configured to receive an input data signal DIN of which the sampling circuit 110 is configured to sample. The clock input terminal C is configured to receive a clock signal CLK of which the sampling circuit 110 is configured to detect sampling transitions (e.g., a rising edge). The data output terminal Q is configured to output an output data signal DOUT at levels and at times based on the levels of the input data signal DIN and the sampling transitions of the clock signal CLK. In particular, the sampling circuit 110 is configured to detect when each of the sampling transitions of the clock signal CLK occur. When the sampling circuit 110 detects that a sampling transition occurs, the sampling circuit 110 samples the level of the input data signal DIN at the data input terminal D, and generates the output data signal DOUT at the level of the input data signal DIN that the sampling circuit 110 identified. The sampling circuit 110 maintains or holds the output data signal DOUT at the data output terminal Q at the level it identified until it detects the next sampling transition of the clock signal CLK. Upon detecting the next sampling transition of the clock signal CLK, the sampling circuit 110 will again identify the level of the input data signal DIN at the data input terminal D, and generate the output data signal DOUT at the level of the input data signal DIN that the sampling circuit 110 identified in response to the next sampling transition. The sampling circuit 110 may continue to operate in this manner as it continues to receive additional data pulses of the input data signal DIN and detect sampling transitions of the clock signal CLK.

FIG. 1D is a schematic diagram illustrating setup time and hold time requirements of the sampling circuit 110. A sampling transition of the clock signal CLK is shown as occurring at a clock event time tce. An occurrence of a sampling transition of the clock signal CLK may be referred to as a clock event. When the sampling circuit 110 detects a sampling transition, it detects a clock event. A time duration from a first time t1 to the clock event time tce denotes the setup time tDS, and a time duration from the clock event time tce to a second time denotes the hold time tDH. In order to meet the setup and hold requirements of the sampling circuit 110, the level of a data pulse of the input data signal DIN should be stable from the first time t1 to the second time t2. A setup violation occurs when the level of input data signal DIN is unstable (it is still changing) after the first time t1 occurs. In other words, a setup violation occurs when the actual amount of time that the level of the input data signal DIN is stable before occurrence of the sampling transition at the clock event time tce is less than the amount of the setup time tDS. In addition, a hold violation occurs when the level of the input data signal DIN is unstable (it changes) before the second time t2. In other words, a hold violation occurs when the actual amount of time that the level of the input data signal DIN is stable after occurrence of the sampling transition at the clock event time tce is less than the amount of the hold time tDH. Setup violations and/or hold violations may occur, for example, due to PVT variations introducing errors in the clock signal CLK that cause drift and shifting of the clock signal CLK relative to the data signal DQ and/or changes in the duty cycle of the clock signal CLK, data signal DQ or a combination thereof.

For a data pulse of the input data signal DIN that the sampling circuit 110 is to sample, at least a portion of the duration that a level of the data pulse is stable—e.g., at least a portion of the duration that the data pulse is at the high level or at the low level—defines a data valid window $T_{DVW}$. A data valid window $T_{DVW}$ is a time period or duration over which a given data pulse occurs during which a sampling circuit is to detect a sampling transition of the clock signal in order to avoid a setup violation and a hold violation. If the sampling transition occurs before the start of the data valid window $T_{DVW}$, then a setup violation occurs—either because the sampling transition occurred before the starting transition of the data pulse, or because the sampling transition occurred too close to after the starting transition that the actual amount of time that the level of the data pulse is stable before occurrence of the sampling transition is less than the setup time tDS. In addition, if the sampling transition occurs after the end of the data valid window $T_{DVW}$, then a hold violation occurs—either because the sampling transition occurred after the ending transition of the data pulse or occurred too close to before the ending transition that the actual amount of time that the level of the data pulse is stable after occurrence of the sampling transition is less than the hold time tDH.

Ideally, the sampling circuit 110 receives the clock signal CLK and the input data signal DIN relative to each other such that the sampling circuit 110 reliably or accurately samples the level of each data pulse in order to correctly identify the data value that each data pulse represents. Configuring the sampling circuit 110 to sample each data pulse in the middle or at a middle point of the duration of each pulse may maximize the latch margin and maximize the chances of this ideal situation occurring. The ideal time at which to sample a data pulse is referred to as a target sampling time of the data pulse. Ideally, the sampling circuit 110 identifies sampling transitions in the middle of the durations of the data pulses and/or at the target sampling times of the data pulses. Accordingly, a given sampling transition is in a target sampling position when the sampling transition occurs at the target sampling time of its associated data pulse.

FIG. 1E shows a data pulse of the input data signal DIN and a pulse of the clock signal CLK, illustrating the ideal case where a sampling transition of the clock pulse is in the target sampling position. In FIG. 1E, a starting transition of the data pulse occurs at a first time t1, and an ending transition of the data pulse occurs at a second time t2. A target sampling time tt of the data pulse occurs in the middle between the first time t1 and the second time t2. Accordingly, a first time period T1 extending from the first time t1 to the target sampling time tt is the same as or equal to a second time period T2 extending from the target sampling time tt to the second time t2. Additionally, the sampling transition associated with the data pulse is the rising transition of the clock pulse. The sampling transition occurs at a sampling time ts. In FIG. 1E, for the ideal case, the sampling transition occurs at the target sampling time—e.g., the sampling time ts and the target sampling time tt are the same.

In actuality, when the sending circuit 102 sends the data signals DQ and the clock signal CLK to the receiving circuit 104, the sampling circuitry of the receiving circuit 104 may not receive the clock pulses in their respective target sampling positions. For a given sampling circuit that samples data pulses of an input data signal in response to sampling transitions of a clock signal, where the sampling transitions occur at times different than the target sampling times tt, the input data signal and the clock signal have skew between them, for example, due to PVT variations in the system. In general, as used herein, skew between a clock signal and a data signal is a deviation of a sampling transition of the clock signal from a target sampling position to sample a data pulse of the data signal. In addition, with respect to sampling times, skew between a clock signal and a data signal is a deviation of a sampling time ts from a target sampling time tt to sample a data pulse of a data signal. For a given pair of clock and data signals, where the clock signal performs sampling transitions at sampling times ts that match or occur at the same times as the target sampling times tt, the clock and data signals do not have skew between them. Alternatively, where the clock signal performs sampling transitions at sampling times ts different than the target sampling times tt (e.g., before or after the target sampling times tt), the clock and data signals have skew between them. An amount of skew (or skew amount) may be quantified by the difference in time between the sampling time ts and the target sampling time tt.

Various manufacturing or environmental conditions may cause skew between clock and data signals, such as imperfections in the alignment and transmission of the clock and data signals by the sending circuit 102, differences in propagation delay in the lines of the communications bus 106, or process-voltage-temperature (PVT) fluctuations, as non-limiting examples. Not only do such manufacturing or environmental conditions displace sampling transitions of the clock signal CLK from their target sampling positions, but they may displace the sampling transitions by different amounts for sampling different data signals DQ. That is, for sampling circuits that sample the input data signals DQ in response to sampling transitions of the clock signal CLK, some sampling circuits may receive sampling transitions of the clock signal CLK further away from the target sampling transitions than others. As operating frequencies continue to increase, differences in timing between the clock signal CLK and different data signals DQ may be more pronounced, requiring correction processes that can flexibly or independently correct for differences in timing for multiple data signals DQ.

While the above description in connection with FIGS. 1A-1E are made in reference to single-ended clock signal CLK, the same concepts apply to a pair of complementary clock signals (e.g., DQS and DQSB). For example, clock signal DQS may be used to coordinate sampling of odd bits of the data signal DQ(i) and the complementary clock signal DQSB used to coordinate sampling of event bits of the data signal DQ(i). In this case, a DQS sampling transition of the clock signal DQS occurs at a clock event time tdqs and a DQSB sampling transition of the clock signal DQSB occurs at a clock event time tdqsb. Each sampling transition of DQS and DQSB includes respective setup and hold times. In order to meet the setup and hold requirements of the sampling circuit 110, the level of an odd data pulse (e.g., $1^{st}$, $3^{rd}$, $5^{th}$, etc. data pulse) of the input data signal DIN should be stable (e.g., the respective data valid window) over the setup and hold time of the for clock signal DQS and the level of an even data pulse (e.g., $2^{nd}$, $4^{rd}$, $6^{th}$, etc. data pulse) of the input data signal DIN should be stable over the setup and hold time of the for clock signal DQSB.

Thus, if the sampling transition of the DQS occurs before the start of the data valid window $T_{DVW}$ for an odd data pulse, then a setup violation occurs—either because the sampling transition occurred before the starting transition of the odd data pulse, or because the sampling transition occurred too close to after the starting transition that the actual amount of time that the level of the odd data pulse is stable before occurrence of the sampling transition is less than the setup time tDS. Similarly, if the sampling transition of the DQSB occurs before the start of the data valid window $T_{DVW}$ for an even data pulse, then a setup violation occurs. In addition, if the sampling transition of the DQS occurs after the end of the data valid window $T_{DVW}$ for an odd data pulse or if the sample transition of the DQSB occurs after the end of the data valid window $T_{DVW}$ for an even data pulse, then a hold violation occurs—either because the sampling transition occurred after the ending transition of the respective data pulse or occurred too close to before the ending transition that the actual amount of time that the level of the respective data pulse is stable after occurrence of the sampling transition is less than the respective hold time.

Ideally, the sampling circuit 110 identifies sampling transitions of the DQS and DQSB in the middle of the durations of the respective data pulses and/or at the target sampling times of the respective data pulses, as described in connection with FIG. 1E above. Accordingly, a given sampling transition is in a target sampling position when the sampling transition occurs at the target sampling time of its associated data pulse.

Figure 2B:
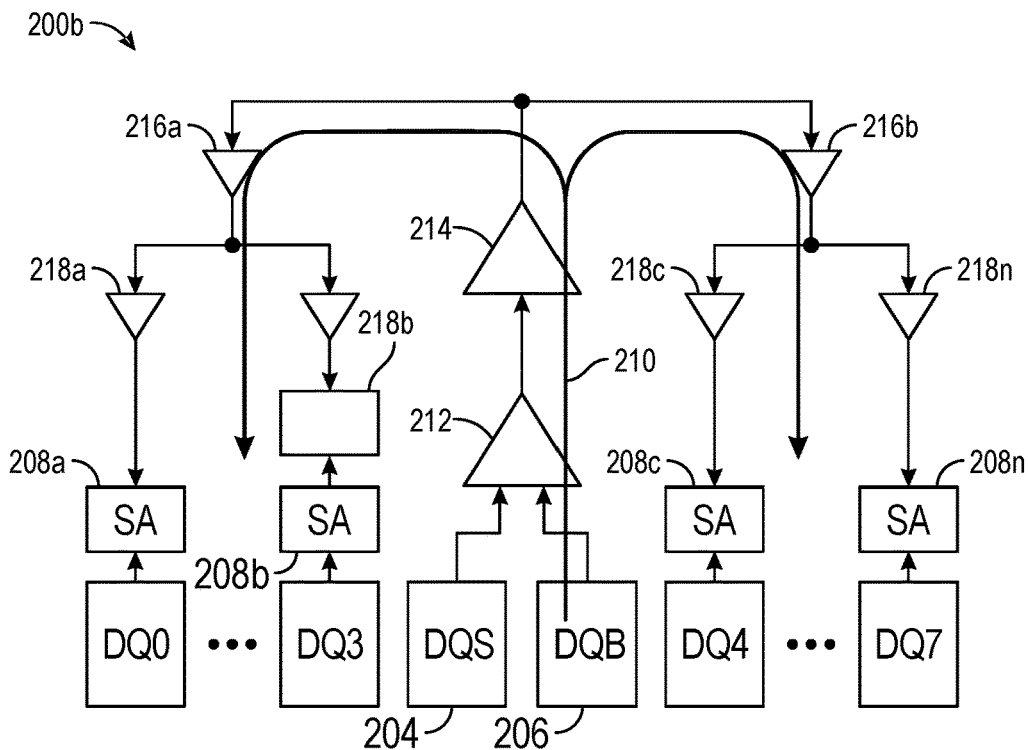
FIG. 2B is an example of an unmatched data signal to data strobe signal architecture.

In some embodiments, the flash memory may comprise a matched or unmatched circuitry, as shown in FIGS. 2A and 2B, respectively. In the case of the matched circuitry 200a, components, such as inverter stages 212, 214, 216a and 216b, and 218a-n and delay stages 202a-n, exist that introduce delay so as to ensure that a clock signal 204, such as a data strobe signal DQS/DQSB (also referred to herein interchangeably as "DQS/DQSB signal"), has a matching or similar delay as a data signal DQ 206 (also referred to herein interchangeably as "DQ signal"), without requiring training to train the memory system on the delay. That is, the matched circuitry 200a uses a DQ replica path of the DQS/DQSB signal to track variations in the DQS/DQSB signal. The unmatched circuitry 200b may not include delay stages that introduce the delay to ensure alignment between the data strobe signal DQS/DQSB and the data signal DQ. Instead, the data signal DQ 204 may be latched directly from a data source (such as the controller) without any delay or other stages via sense amplifiers 208a-n. Sense amplifiers may be implemented as time-interleaved scheme. However, the data strobe signal DQS/DQSB may still traverse a clock path, which may introduce one or more delays, etc., into the data strobe signal DQS/DQSB. Thus, a delay value tDQS2DQ (also referred to herein as "tDQS2DQ delay" and shown as arrow 210) may exist between the data strobe signal DQS/DQSB and the data signal DQ where the delay represented by the tDQS2DQ delay value is may be, at least in part, a result of variations in the data strobe signal DQS/DQSB and represents an amount of delay between the data strobe signal DQS/DQSB and the data signal DQ.

In the matched circuitry 200a, changes in the tDQS2DQ delay value may be compensated for, without training, using the delay stages 202a-n introduced above in one or both of the data strobe signal DQS/DQSB or the data signal DQ. On the other hand, in the unmatched circuitry 200b, changes in the tDQS2DQ delay value, which may be results of process, voltage, and/or temperature (PVT) variations in an environment of the circuitry, may need to be compensated for, where no delay stages exist to introduce delay in the unmatched circuitry. As such, changes in the tDQS2DQ for the unmatched circuitry need to be detected and compensated for in the unmatched circuitry 200b, such as through the use of write training (also referred to herein as a skew correction process).

Detection of the tDQS2DQ delay may be performed in various ways. For example, certain memory systems may utilize an oscillator circuit to determine the delay. More specifically, the certain memory systems may generate the oscillator circuit that generally corresponds to a replica or representation of the clock path for the data strobe signal DQS/DQSB using a number of inverters arranged in series to create, for example, a ring oscillator. In the ring oscillator, as a delay in the clock path for the data strobe signal DQS/DQSB increases, a frequency output by the ring oscillator increases. Thus, the output of the ring oscillator corresponds to the tDQS2DQ delay. By comparing tDQS2DQ delay values generated by the ring oscillator over time, changes in the tDQS2DQ delay can be identified as PVT and other variations are experienced. Based on analysis of the tDQS2DQ delay and changes thereof, the controller of the memory system may determine whether to retrain the memory interface to maintain successful data operations, where PVT variations and other changes can cause timing changes that further cause data operations to fail as timings of the data strobe signal DQS/DQSB and other signal changes.

Figure 3:
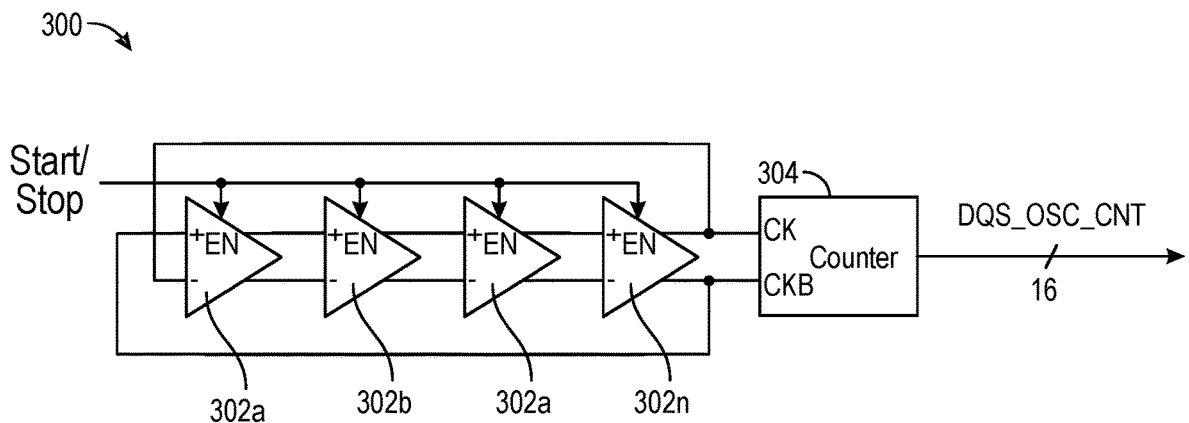
FIG. 3 is an example architecture of a clock interval oscillator circuit.

For example, FIG. 3 illustrates an example architecture of a clock interval oscillator circuit 300, which may be included in a memory system to inform an amount of drift in tDQS2DQ by PVT variations. The oscillator circuit 300 includes a number of inverter stages 302a-n arranged in series to create, for example, a ring oscillator that may generally correspond to a replica or representation of the clock path for the data strobe signal DQS/DQSB. The oscillator circuit 300 is enabled/disabled by DQS oscillator START command and disabled by STOP command. The oscillator circuit 300 is also connected to a counter 304. The oscillation frequency of the oscillator circuit 300 may be one half of tDQS2DQ, which causes the DQS_OSC_CNT value to increase by 1 whenever it passes 2×tDQS2DQ. Using the counter value, tDQS2DQ can be calculated as follows:

$$tDQS2DQ = \frac{\text{run\_time}}{2 \times \text{Counter\_Value}} \quad \text{Eq. 1}$$

Consequently, the resolution of tDQS2DQ measurement by the oscillator circuit 300 may be:

$$\Delta tDQS2DQ = \frac{2 \times tDQS2DQ^2}{\text{run\_time}} \quad \text{Eq. 2}$$

Using the Eq. 2, as an example, 500 ns run time may be required to achieve 1 ps resolution when tDQS2DQ is 500 ps. Thus, the output of the oscillator circuit 200 may correspond to the tDQS2DQ delay and by reading the DQS_OSC_CNT value through mode register read command, the controller of the memory system may adjust DQ timing or retrain the input/output to address delay in the tDQS2DQ.

Figure 4:
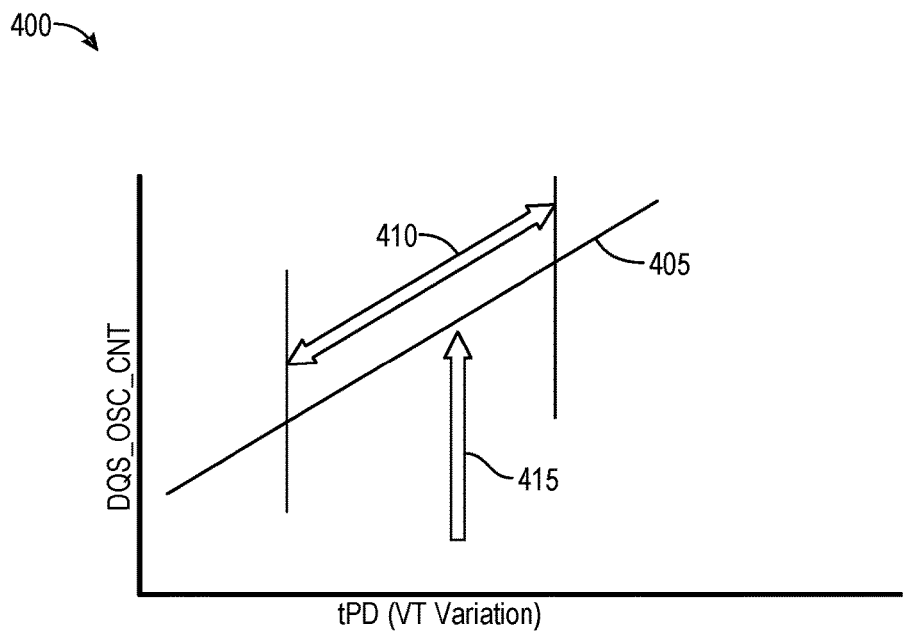
FIG. 4 depicts a graphical representation of a change in delay between a data strobe signal and data signal plotted against PVT variations detected using the clock interval oscillator circuit of FIG. 3.

For example, FIG. 4 depicts a graphical representation of the change in tDQS2DQ plotted against PVT variations. As described above, the change in tDQS2DQ is related to the DQS_OSC_CNT from the oscillator circuit, which increases with increased PVT variations as shown by line 405. The controller of the memory system may determine to retrain the input/output to address the delay in the tDQS2DQ if the DQS_OSC_CNT is within a retraining region 410, as shown in FIG. 4. The retraining region may be based on an initial reference state 415 of the PVT, from which the PVT variations are gauged. Reference of initial state may refer to a reference for deciding whether to retrain or not. After an initial training, the retraining window 410 is maximized. Then, after some time of operation, when PVT variations are detected, retraining may be decided by system budget.

FIG. 5 depicts tables of function parameters for operation of the oscillator circuit 300 and detection of delay in the tDQS2DQ. The oscillator circuit 300 may utilize tables 510 and 520 to detect a delay in the tDQS2DQ. Tables 510 and 520 include parameter values of "TBD", which indicates that such values are not yet defined, and may be determined by system specifications. Thus, the parameters may be based on the system in which the oscillator circuit 300 is implemented.

However, the use of the oscillator circuit described above by the certain memory systems may limit detection of relevant changes to changes in the tDQS2DQ delay. For example, the oscillator circuit may be unable to detect duty cycle variations of the data signal DQ and/or duty cycle variations of the data strobe signal DQS/DQSB. This may be because the oscillator circuit is able to detect cycle to cycle delays, which is just delay variation. Furthermore, because the oscillator circuit utilizes additional components that emulate the clock path, the oscillator circuit introduces increased components and associated costs and sacrifices real estate in the memory system.

Figure 6A:
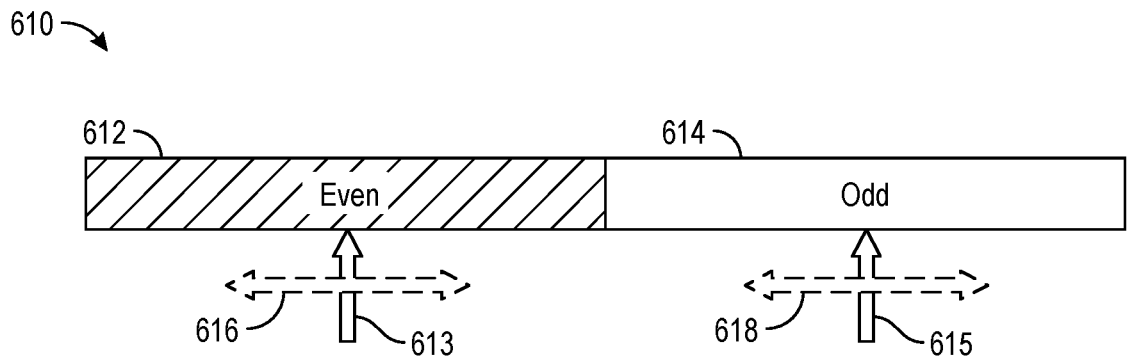
FIG. 6A illustrates an example error or variation that can be detected using the clock interval oscillator circuit of FIG. 3.
Figure 6B:
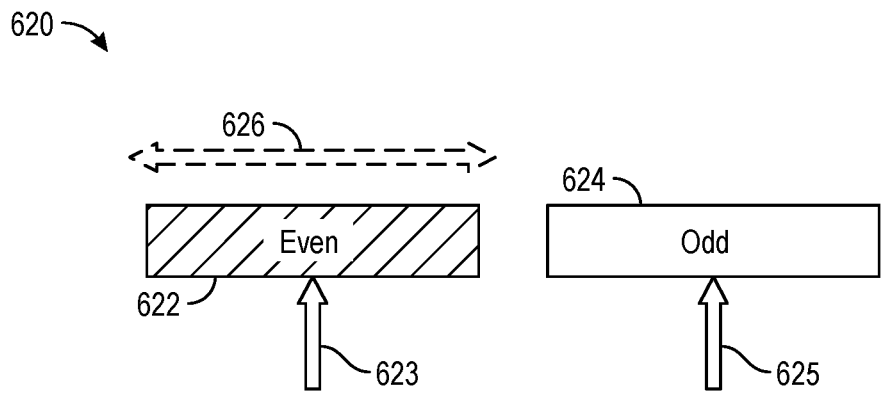
FIGS. 6B and 6C illustrate example errors that may neglected or missed by the clock interval oscillator circuit of FIG. 3.
Figure 6C:
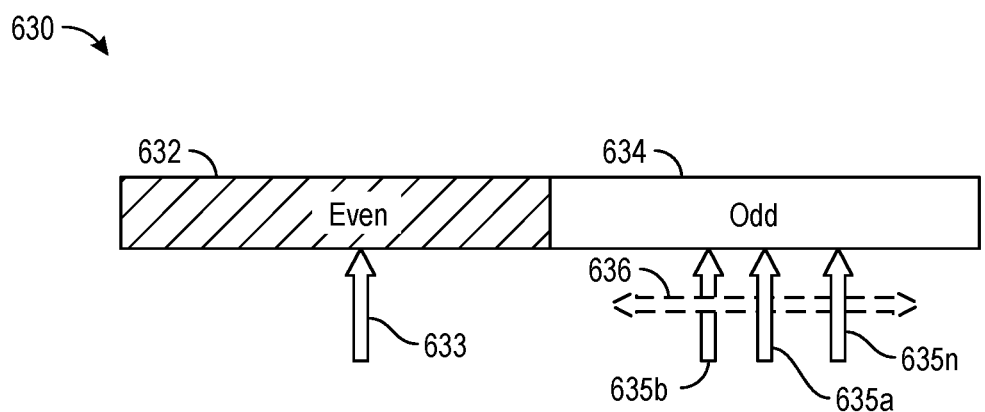

For example, FIG. 6A illustrates an example error or variation that can be detected using the oscillator circuit 300 of FIG. 3, while FIGS. 6B and 6C illustrate example errors that may neglected or missed by the oscillator circuit 300.

FIG. 6A shows a first data block diagram 610 having an even data block 612 and an odd data block 614. The first data block diagram 610 further includes arrow 613 representing a rising edge (e.g., a sampling transition) of the data strobe signal DQS placed at a location or time in the even data block 612. First data block diagram 610 also includes arrow 616, which represents changes in location or times in the even data block 612 of the rising edge of the data strobe signal DQS based on shifts (e.g., drift or skew) in the data strobe signal DQS due to one or more PVT or other variations experienced by or in a corresponding clock tree. Similarly, arrow 615 represents a rising edge of the data strobe signal DQS placed at a given location or time in the odd data block 614. Arrow 618 represents changes in location or times in the odd data block 614 of the rising edge of the data strobe signal DQS based on shifts (e.g., drift or skew) in the data strobe signal DQS due to one or more PVT or other variations experienced by or in a corresponding clock tree. Arrows 616 and 618 may be representative of variations or changes in the delay value tDQS2DQ as detected by the oscillator circuit 300. That is, changes in the delay between the data strobe signal DQS and the data signal DQ.

However, the oscillator circuit 300 is unable to detect duty cycle variations of the data signal DQ, as shown in FIG. 6B, or duty cycle variations of the data strobe signal DQS/DQSB, as shown in FIG. 6C. FIG. 6B shows a second data block diagram 620 having an even data block 622 and an odd data block 624. Arrows 623 and 625 represent rising edges of a data strobe signal DQS placed at a given location or time in the even data block 622 and odd data block 624. Arrow 626 represents variation in the data signal DQ which the oscillator circuit 300 is unable to detect; thus, unable to compensate for. Similarly, FIG. 6C shows a third data block diagram 630 having an even data block 632 and an odd data block 634. Arrows 633 and 635a-n represent rising edges of a data strobe signal DQS placed at a given location or time in the even data block 632 and odd data block 634. Arrow 636 represents variation in the duty cycle of the data strobe signal DQS, which the oscillator circuit 300 is also unable to detect; thus, unable to compensate for. Arrows 635a-n represent various locations or times that the rising edge of the data strobe signal DQS as a result of the variations represented by arrow 636. That is, arrow 635a may represent an ideal location in the odd data block 634, but due to variations shown as arrow 635 the rising edge of the data strobe signal DQS may be located elsewhere, such as at arrow 635*b* or 635*n*.

The technology disclosed herein provides the ability to detect the occurrence of variations in the duty cycle variations of the data signal DQ and/or duty cycle variations of the data strobe signal DQS/DQSB, along with the delay value tDQS2DS. By detecting such variations, the technology disclosed herein is able to train and/or retrain a memory system on the detected variations, so to compensate for the variations in data signal DQ, the duty cycle variations of the data signal DQ and/or duty cycle variations of the data strobe signal DQS/DQSB, which the oscillator circuit embodiment described above is unable to address. The technology disclosed herein utilizes existing components and functionality to provide this additional error detection and other improvements over the oscillator circuit embodiment. For example, a controller may use write training, described in greater detail below, to train (or calibrate) a memory interface on a data strobe signal DQS/DQSB relative to a data pulse of a data signal DQ. The controller then detects changes in PVT causing a drift or skew based on PVT that exceed a threshold amount. Responsive to the detected PVT change, the controller identifies a variation in one or more of the delay value tDQS2DQ delay, the duty cycle of the data strobe signal DQS/DQSB, and the duty cycle of the data signal DQ that disrupts timing of the data strobe signal DQS/DQSB relative to a data window of the data signal DQ. For example, the controller detects a failure of a data operation (e.g., a calibration or test data operation) due to locating or timing data strobe signal DQS/DQSB outside of a minimum threshold window (or range). The minimum threshold window may correspond to a minimum acceptable range or limits on either side of the ideal or optimum position (e.g., the center of the valid data window) that a data strobe signal DQ/DQSB may be located or timed withing a valid data window of a data pulse of the data signal DQ. Accordingly, responsive to a failure within the minimum threshold window (or a pass of the data operation outside of the minimum threshold window), the controller can trigger a retraining of the memory interface on the data strobe signal DQS/DQSB relative to a data pulse of a data signal DQ. Retraining the memory interface may realign or place the data strobe signal DQS/DQSB at an ideal timing relative to the valid data window of the data signal DQ. In some embodiments, the ideal timing relative to the data window of the data signal DQ may correspond to a timing in the data window where a setup and hold time, and corresponding margins, of the data window are substantially maximized and equal. Thus, the technology disclosed herein may provide additional functionality in error detection without sacrificing system real estate or increasing component costs of, for example, oscillator circuit embodiments.

It should be noted that the terms "optimize," "optimal" and the like as used herein can be used to mean making or achieving performance as effective or perfect as possible. However, as one of ordinary skill in the art reading this document will recognize, perfection cannot always be achieved. Accordingly, these terms can also encompass making or achieving performance as good or effective as possible or practical under the given circumstances, or making or achieving performance better than that which can be achieved with other settings or parameters.

Figure 7A:
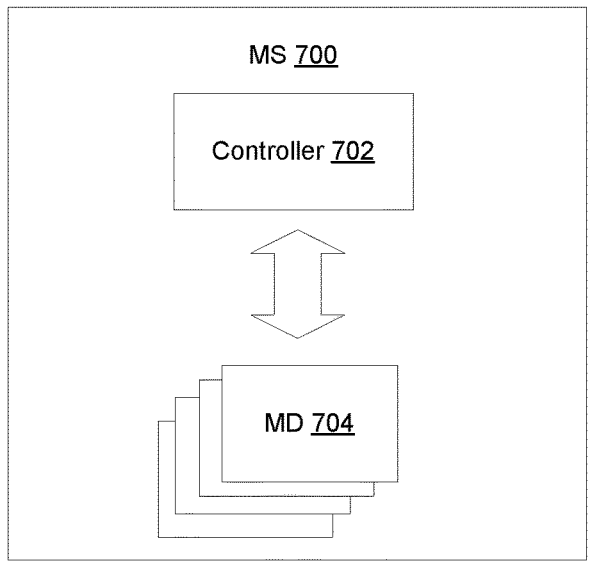
FIG. 7A illustrates a block diagram of a memory system used to implement various features of embodiments described in the present disclosure.

FIG. 7A illustrates a block diagram of a memory system 700. The memory system 700 may include a controller 702 and memory that may be made up of one or more memory dies 704. As used herein, the term die refers to the set of memory cells and associated circuitry for managing the physical operation of those memory cells that are formed on a single semiconductor substrate. The controller 702 may interface with a host system and transmit command sequences for read, program, and erase operations to the memory die(s) 704. The interface may include a bus or other communication mechanism, not shown, for communicating information.

The controller 702 (e.g., a flash memory controller) and/or any of the modules therein can take the form of processing circuitry, a microprocessor or processor, and/or a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 702 can be configured with hardware and/or firmware to perform the various functions described below and shown in the flow diagrams. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

In some embodiments, the controller 702 is a device that manages data stored in the memory die(s) 704 and communicates with a host, such as a computer or electronic device. The controller 702 can have various functionality in addition to the specific functionality described herein. For example, the controller 702 can format the memory dies 704 to ensure that they are operating properly, map out failed flash memory cells, and allocate spare cells to be substituted for future failed cells. Some part of the spare cells can be used to hold firmware to operate the controller 702 and implement other features. In operation, when a host needs to read data from or write data to the memory die(s) 704, the host will communicate with the controller 702. If the host provides a logical address to which data is to be read/written, the controller 702 can convert the logical address received from the host to a physical address in the memory die(s) 704. Alternatively, the host can provide the physical address to the controller 702. The controller 702 can also perform various memory management functions and operations, such as, but not limited to, wear leveling (distributing writes to avoid wearing out specific blocks of memory that would otherwise be repeatedly written to), garbage collection (after a block is full, moving only the valid pages of data to a new block, so the full block can be erased and reused), erasing, programming, and reading.

The interface between the controller 702 and the non-volatile memory die(s) 704 may be any suitable interface, such as a flash or memory interface. For some example embodiments, the memory system 700 may be a card-based system, such as a secure digital (SD) or a micro secure digital (micro-SD) card. In alternate example embodiments, the memory system 700 may be part of an embedded memory system.

The controller 702 may include a front-end module that interfaces with a host, a back-end module that interfaces with the memory die(s) 704, such as the memory interface, and various other modules that perform various functions of the memory system 700. In general, a module may be hardware or a combination of hardware and software. Module may include one or more electronic circuits that include electronic components for performing the functionality of one or more instructions. For example, each module may include an application specific integrated circuit (ASIC), a field programmable gate array (FPGA), a circuit, a digital logic circuit, an analog circuit, a combination of discrete circuits, gates, or any other type of hardware or combination thereof. In addition, or alternatively, each module may include memory hardware that comprises instructions executable with a processor or processor circuitry to implement one or more of the features of the module. When any one module includes the portion of the memory that comprises instructions executable with the processor, the module may or may not include the processor. In some examples, each module may just be the portion of the memory that comprises instructions executable with the processor to implement the features of the corresponding module without the module including any other hardware. Because each module includes at least some hardware even when the included hardware comprises software, each module may be interchangeably referred to as a hardware module. Each module may include one or more instructions for execution of logic of one or more circuits described herein. In some embodiments, the controller 702 may fetch, decode, and/or execute the one or more instructions to control processes and/or operations for enabling aspects of the present disclosure.

In general, the word "component," "module," "system," "database," data store," and the like, as used herein, can refer to logic embodied in hardware or firmware, or to a collection of software instructions, possibly having entry and exit points, written in a programming language, such as, for example, Java, C or C++. A software component may be compiled and linked into an executable program, installed in a dynamic link library, or may be written in an interpreted programming language such as, for example, BASIC, Perl, or Python. It will be appreciated that software components may be callable from other components or from themselves, and/or may be invoked in response to detected events or interrupts. Software components configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression, or decryption prior to execution). Such software code may be stored, partially or fully, on a memory device of the executing computing device, for execution by the computing device. Software instructions may be embedded in firmware, such as an EPROM. It will be further appreciated that hardware components may be comprised of connected logic units, such as gates and flip-flops, and/or may be comprised of programmable units, such as programmable gate arrays or processors.

In the example illustrated in FIG. 7A, the memory system 700 is shown as including a single channel between the controller 702 and the non-volatile memory die(s) 704. However, the subject matter described herein is not limited to memory systems having a single memory channel. For example, in some memory systems, such as those embodying NAND architectures, 2, 4, 8 or more channels may exist between the controller 702 and the memory die(s) 704, depending on capabilities of the controller 702. In any of the embodiments described herein, more than a single channel may exist between the controller 702 and the memory dies 704, even if a single channel is shown in the drawings.

Figure 7B:
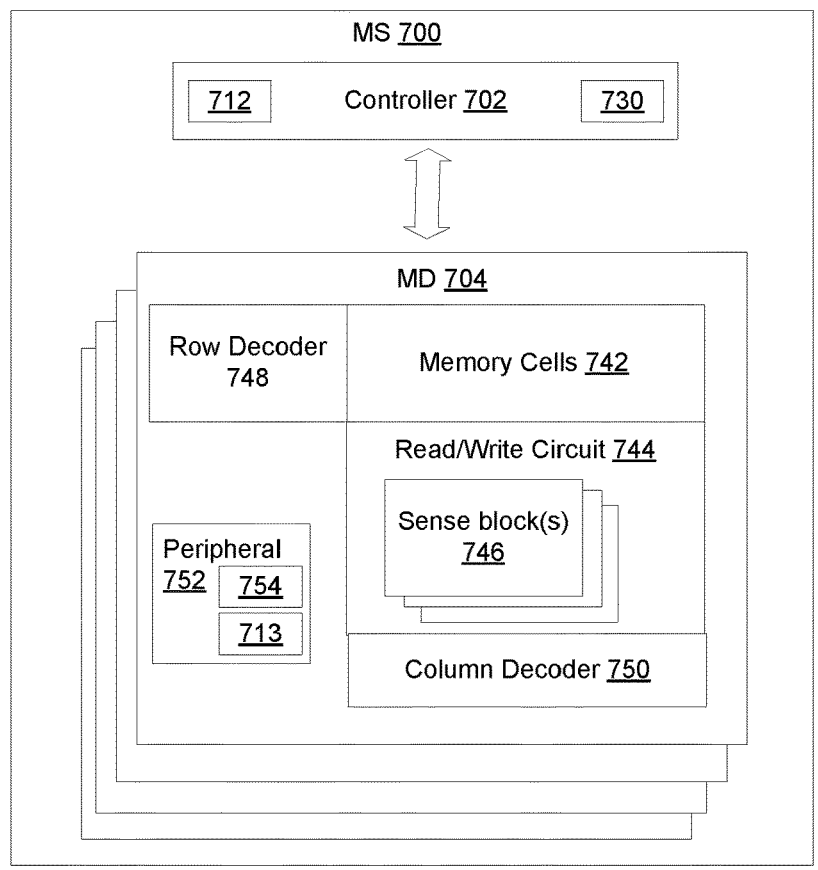
FIG. 7B illustrates a block diagram of example components of the memory system of FIG. 7A in more detail, which can be used to implement various features of embodiments described in the present disclosure.

FIG. 7B illustrates a block diagram of example components of the memory system 700, and more specifically the memory dies 704, in more detail. As shown, the memory dies 704 may include a memory cell structure 742 that includes a plurality of memory cells or memory elements (not individually shown). Any suitable type of memory can be used for the memory cells. As examples, the memory cells can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor memory elements capable of storing information. Each type of memory may have different configurations in the memory cell structure 742. For example, flash memory devices may be configured in a NAND or a NOR configuration.

The memory can be formed from passive and/or active elements, in any combination(s). By way of non-limiting example, passive semiconductor memory elements include ReRAM device elements, which in some embodiments, include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments, include elements containing a charge storage region, such as a floating gate, conductive nanoparticles, or a charge storage dielectric material.

Multiple memory elements in the memory cell structure may be configured so that they are connected in series or so that each element is individually accessible. By way of non-limiting example, flash memory devices in a NAND configuration (NAND memory) typically contain memory elements connected in series. The memory cell structure 742 can include a NAND memory array. The NAND memory array may be configured so that the array is composed of multiple NAND strings of memory in which a NAND string is composed of multiple memory elements sharing a single bit line and accessed as a group.

The NAND strings can include multiple transistors in series between a first select gate (e.g., a drain-side select gate) and a second select gate (e.g., a source-side select gate). A first select gate can connect the NAND string to a bit line. The second select gate can connect the NAND string to a source line. Each of the transistors in the NAND string can include a control gate and a floating gate. Control gates of respective transistors can be connected to word lines, respectively. Although four floating-gate transistors are described with reference to a NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system, for example the memory system 700, using a NAND flash memory structure includes a plurality of NAND strings within a memory block. In some cases, the NAND strings within a memory block may share a common well (e.g., a P-well). Each NAND string may be connected to a common source line by its source-side select gate (e.g., controlled by select line) and connected to its associated bit line by its drain-side select gate (e.g., controlled by select line). Typically, each bit line runs on top of (or over) its associated NAND string in a direction perpendicular to the word lines and is connected to a sense amplifier.

Alternatively to a NAND memory array, memory elements may be configured so that each element is individually accessible, e.g., a NOR memory array. NAND and NOR memory configurations are merely non-limiting examples, and memory elements may be otherwise configured. Although technology using NAND-type flash memory may be described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

The semiconductor memory elements located within and/or over a substrate of memory die 704 may be arranged in two or three dimensions, such as a two-dimensional (2D) memory structure or a three-dimensional (3D) memory structure. In a two-dimensional memory structure, the semiconductor memory elements are arranged in a single plane or a single memory device level. Typically, in a two-dimensional memory structure, memory elements are arranged in a plane (e.g., in an x-z direction plane) which extends substantially parallel to a major surface of a substrate that supports the memory elements. The substrate may be a wafer over or in which the layer of the memory elements is formed, or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three-dimensional memory array is arranged so that memory elements occupy multiple planes or multiple memory device levels, thereby forming a structure in three dimensions (e.g., in the x, y and z directions, where the y direction is substantially perpendicular, and the x and z directions are substantially parallel to the major surface of the substrate).

As previously alluded to, in one embodiment, the memory cell structure 742 may be divided into many blocks (e.g., blocks 0-1023, or another amount) of memory cells. A block contains a set of NAND strings, which are accessed via bit lines and word lines. Typically, all the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

The memory die 704 may further include read/write circuits 744 that include a plurality or p-number of sense blocks (also referred to as sense modules or sense circuits). The sense blocks can be configured to participate in reading or programming a page of memory cells in parallel. In one embodiment, each sense block includes a sense amplifier and a set of latches connected to the bit line. The latches store data to be written and/or data that has been read. The sense blocks may include bit line drivers.

The memory die 704 may also include a row address decoder 748 and a column address decoder 750. The row address decoder 748 may decode a row address and select a particular word line in the memory cell structure 742 when reading or writing data to/from the memory cell structure 742. The column address decoder 750 may decode a column address to select a particular group of bit lines in the memory cell structure 742 to read/write from read/write circuits 744.

In addition, the non-volatile memory die 704 may include peripheral circuitry 752. The peripheral circuitry 752 may include control logic circuitry, which may be implemented as a state machine, that provides on-chip control of memory operations as well as status information to the controller 702. The peripheral circuitry 752 may also include an on-chip address decoder that provides an address interface between addressing used by the controller 702 and/or a host and the hardware addressing used by the row and column decoders 748 and 750, respectively. In addition, the peripheral circuitry 752 may also include volatile memory. An example configuration of the volatile memory may include latches, although other configurations are possible.

Additionally, the peripheral circuitry 752 may include power control circuitry that is configured to generate and supply voltages to the memory cell structure 742. Such voltages may include voltages (including program voltage pulses) to the word lines, erase voltages (including erase voltage pulses), the source select gate bias voltage to the source select gate bias line; the drain select gate bias voltage to the drain select gate bias line, and a cell source voltage on the source lines. Still other voltages may be supplied to the memory cell structure 742, the read/write circuits 744, and/or other circuit components on the memory die 704. The various voltages that are supplied by the power control circuitry are described in further detail below. The power control circuitry may include any of various circuit topologies or configurations to supply the voltages at appropriate levels to perform the read, write, and erase operations, such as driver circuits, charge pumps 754, reference voltage generators, and pulse generation circuits, or a combination thereof. Other types of circuits to generate the voltages may be possible. In addition, the power control circuitry may communicate with and/or be controlled by the control logic circuitry, the read/write circuits 744, and/or the sense blocks to supply the voltages at appropriate levels and appropriate times to carry out the memory operations.

To program a target memory cell, and in particular a floating gate transistor (FGT), the power control circuitry can apply a program voltage to the control gate of the memory cell, and the bit line that is connected to the target memory cell is grounded, which in turn causes electrons from the channel to be injected into the floating gate. As previously described, in a block, one memory cell in each of the NAND strings can share the same word line.

As previously described, the threshold voltage VTH of a memory cell may identify the data value of the data it is storing. For a given read operation in a block, a memory cell from which data is to be read is referred to as a selected memory cell, and a memory cell from which data is not to be read is referred to as an unselected memory cell. So, when data is to be read from a page of memory cells for a particular read operation, those memory cells in the page are the selected memory cells, and the memory cells of the block that are not part of the page are the unselected memory cells. Additionally, a word line connected to the page of selected memory cells is referred to as the selected word line, and the other word lines of the block are referred to as the unselected word lines.

During a read operation to read data stored in target memory cells of a page, the sense blocks may be configured to perform a sense operation that senses whether current is flowing through the bit lines connected to the target memory cells of the page. The voltage supply circuitry (described with reference to peripheral circuitry 752 in FIG. 7B) may supply voltages on the selected and unselected word lines at appropriate levels that cause current to flow or not to flow based on the threshold voltage VTH of the target memory cells. For some configurations, the level of the voltage supplied to the selected word lines may vary depending on the states of the memory cells.

The voltage supply circuitry may also bias the bit lines so that the high supply voltage is applied to the drain side of the bit lines and the cell source voltage is applied to the source side of the bit lines to allow for the current flow, provided that the threshold voltage VTH of the selected memory cell allows for it.

In some embodiments, the controller 702 may include a memory interface 730, a duty cycle control circuitry, and a duty cycle monitor 712. The memory interface 730 may provide command sequences to the memory die 704 and receive status information from the memory die 704. In one embodiment, the memory interface 730 may be a double data rate (DDR) interface, such as a Toggle Mode 200, 400, or 800 interface. The duty cycle control circuit may adjust a duty cycle of a data strobe signal provided to the memory die 704, while the duty cycle monitor 712 may monitor a duty cycle of a data strobe signal returned from the memory die 704. More specifically, the duty cycle monitor 712 may be configured to monitor continuously or intermittently the data strobe signal coming back from the memory die 704. The duty cycle monitor 712 may monitor whether the clock duty cycle meets some threshold or target range (e.g., close to 50% or within some pre-defined range (for example, +/−1%)).

The memory die 704 may further comprise a duty cycle monitor 713 included in the peripheral circuitry 752, for example. The duty cycle monitor 713 may monitor the duty cycle of the data strobe signal sent from the controller 702. The duty cycle monitor 713 may perform dynamic duty cycle correction during a write operation as part of a two-step operation.

In step one, which may take place during the write operation, the data strobe signal is provided from the controller 702 to the memory die 704. The data strobe signal may pass through the duty cycle control circuit and go to the memory die 704. The duty cycle monitor 713 may monitor the duty cycle of the data strobe signal and generate a duty cycle value, which may be saved. In step two, which takes place during a subsequent read operation, the controller 702 communicates with the memory chip 704 to collect the duty cycle information stored in the data sent from the memory die. In some embodiments, this information may be provided as data to the controller 702 (for example, over a data bus). The controller 702 may use this information to program the duty cycle control circuit accordingly to correct the duty cycle of the data strobe signal provided from the controller 702 to the memory die 704.

In some embodiments, each of the duty cycle monitor 712, 713 may comprise a phase frequency detector (PFD), a filter/delay control, a digital delay line. In some embodiments, the duty cycle monitors 712, 713 are coupled to a delay tap comparer that compares monitored duty cycles.

It should be noted that not all of the components shown in FIG. 7B may be needed in various embodiments. For example, the duty cycle monitor 713 in the memory die 704 may not be needed when the memory system 700 performs dynamic duty cycle correction during a read operation.

The controller 702 may also be configured to perform a skew correction processes (also referred to herein as a write training process). As used herein, a skew correction process or write training is a process that detects skew or drift between a data strobe signal and a data signal and informs the controller (e.g., trains or learns) on the detected skew or drift. In addition or alternatively, the skew correction process may use this detected skew to compensate for the skew or drift, for example, by moving or delaying sampling transitions (e.g., rising edges) of a data strobe signal DQS toward, from a side of the data window, toward a target or optimal position within the data signal DQ to sample data pulses of the data signal and identifying the optimal or target position accordingly. The rising edge of the data strobe signal DQS/DQSB may then be positioned according to the detected optimal position.

Figure 8:
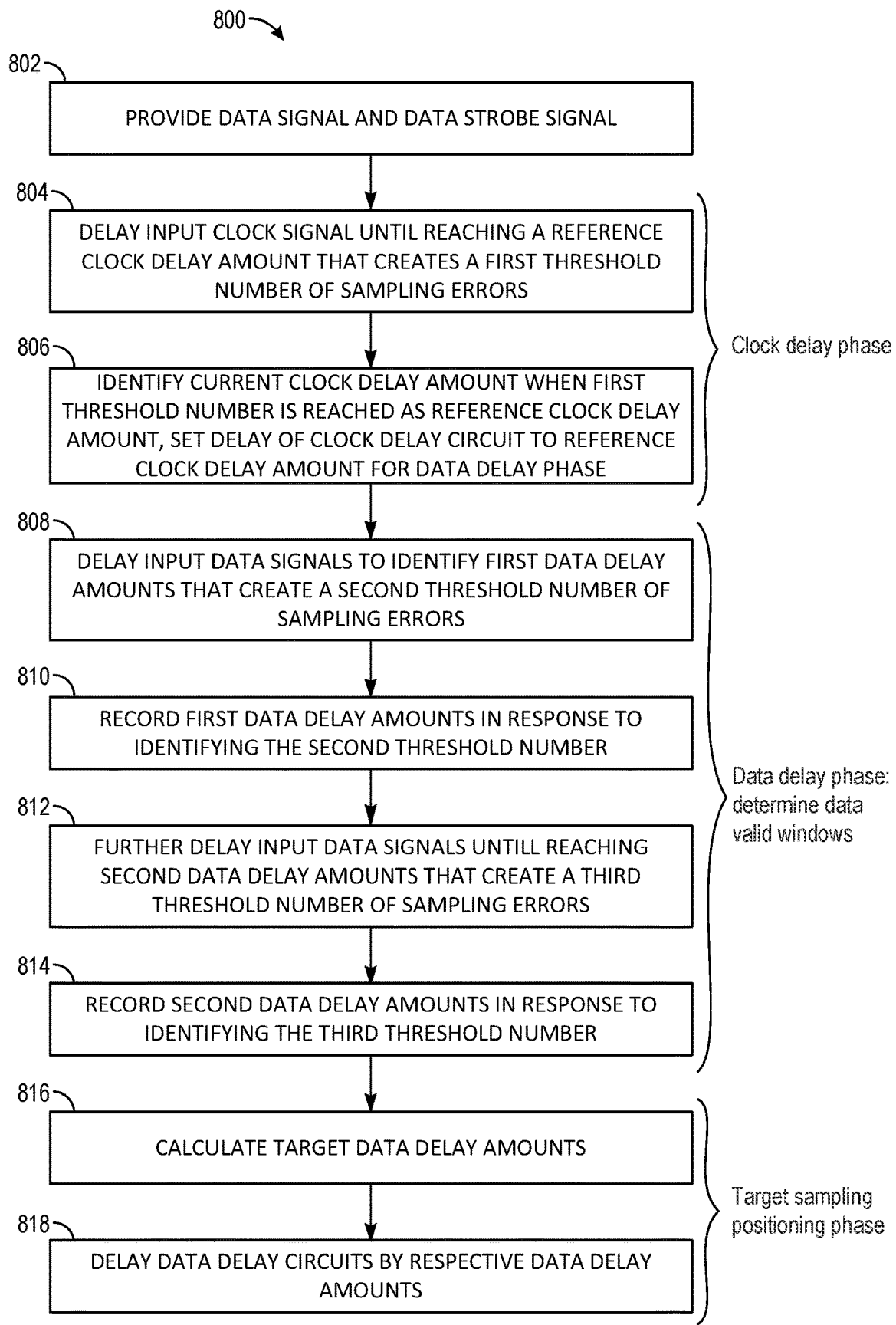
FIG. 8 is a flow chart of an example method of performing a write training process.

FIG. 8 illustrates an example method of performing a skew correction (or write training) process according to embodiments disclosed herein. FIG. 8 shows a flow chart of an example method 800 of performing a skew correction process. FIG. 8 shows example steps that can be performed by the controller 702 (or an external controller or the memory interface 730, separate from or part of the controller 702) configured to coordinate data operations with a memory cell, such as a memory cell of the memory cell structure 742. For example, the controller 702 can fetch, decode, and/or execute one or more instructions for performing various steps of the method 800. Various instructions (e.g., for performing one or more steps described herein) can be stored in non-transitory storage medium of controller 702 and/or control logic circuitry of peripheral circuit 752, where the term "non-transitory" does not encompass transitory propagating signals. "Non-transitory" as used herein refers to any media that store data and/or instructions that cause a machine to operate in a specific fashion. Such non-transitory media may comprise non-volatile media and/or volatile media. Non-volatile media includes, for example, optical or magnetic disks. Volatile media includes dynamic memory. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same. As described in detail below, machine-readable storage medium of controller 702 may be encoded with executable instructions, for example, instructions for executing steps of the method 800. Non-transitory media is distinct from but may be used in conjunction with transmission media. Transmission media participates in transferring information between non-transitory media. For example, transmission media includes coaxial cables, copper wire and fiber optics, including the wires that comprise bus between the controller 702 and a host. Transmission media can also take the form of acoustic or light waves, such as those generated during radio-wave and infra-red data communications.

At block 802, the data strobe signal and data signals are provided. For example, a data strobe signal is provided from a controller (e.g., controller 702) to the memory (e.g., memory die 104 (block 312). The data strobe signal is used in the memory to provide the controller with data read out of the memory or data written into the memory. At block 804, the controller 702 may delay the input data strobe signal until the controller 702 identifies that a number of sampling errors reaches a first threshold number of sampling errors, such as a number of sampling errors set in advance. The first threshold number may indicate a first threshold number of hold violations. The controller 702 increases the clock delays over one or more iterations. During each iteration, the controller 702 may increase the clock delay by one or more increments.

During a given one of the iterations, the controller 702 identifies that the number of sampling errors has reached the first threshold number. At block 806, in response to identification of the first threshold number, the controller 702 may identify a current clock delay amount by which the input data strobe signal is being delayed. The controller 702 may identify the current clock delay amount as the delay amount that created the first threshold number of sampling errors, and in response, identify the current clock delay amount as the reference clock delay amount. If not set already, the controller 702 may set the clock delay to a reference clock delay amount, and transition to a data delay phase.

The data delay phase may begin at block 808, with the controller 702 identifying first data delay amounts that create a second threshold number of sampling errors, which is generally lower than the first threshold number. The second threshold number may indicate a second threshold number of hold violations. During the data delay phase, the controller 702 may maintain or hold constant the clock delay at the reference clock delay amount. In addition, the controller 702 increase the data delays over one or more iterations. During each iteration, the controller 702 may increase a data delay by one or more increments.

During one or more iterations, the controller 702 identifies that the number of sampling errors has reached the second threshold number. In some example methods, the controller 702 may identify that the second threshold number is reached over a plurality of iterations. For example, where the controller 702 is configured to independently control the delay, the controller 702 may identify that the second threshold number is reached during different iterations.

At block 810, in response to identification of the second threshold number, the controller 702 may identify current data delay amounts that the input data signals DQ is being delayed. The controller 702 may identify the current data delay amounts as the delay amounts that created the second threshold number of sampling errors, and in response, identify the current data delay amounts as the first data delay amounts. A first data delay amount may indicate an upper bound of a data valid window $T_{DVW}$. Accordingly, the first data delay amounts may identify upper bounds of respective data valid windows $T_{DVW}$, and in turn identify minimum delay amounts to set the reference clock delay amount in order to avoid a hold violation. The controller 702 may record the first data delay amounts for later calculation of target data delay amounts.

At block 812, the controller 702 may continue to delay the data signal DQ until identifying second data delay amounts that create a third threshold number of sampling errors, which is generally higher than the second threshold number and less than the first threshold number. As with block 808, the controller 702 may continue to delay the data signal DQ by increasing the data delays over one or more iterations. During each iteration, the controller 702 may increase a data delay by one or more increments.

During one or more iterations, the controller 702 identifies that the number of sampling errors has reached the third threshold number. In some example methods, the controller 702 may identify that the third threshold number is reached over a plurality of iterations. For example, where the controller 702 is configured to independently control the delay of data signals, the controller 702 may identify that the third threshold number is reached for during different iterations.

At block 814, in response to identification of the third threshold number, the controller 702 may identify current data delay amounts the input data signals DQ are delayed. The controller 702 may identify the current data delay amounts as the delay amounts that created the third threshold number of sampling errors, and in response, identify second data delay amounts based on the current data delay amounts. A second data delay amount may indicate a lower bound of a data valid window $T_{DVW}$. Accordingly, the second data delay amounts may identify lower bounds of respective data valid windows $T_{DVW}$, and in turn identify maximum delay amounts to delay respective data signals DQ set to the reference clock delay amount in order to avoid a setup violation. The controller 702 may record the second data delay amounts for later calculation of one or more target data delay amounts.

At block 816, the controller 702 may calculate target data delay amounts based on the first and second data delay amounts. In an example method, the controller 702 may average a given pair of first and second data delay amounts to determine a target delay amount. For a given pair of first and second data delay amounts, the first data delay amount may indicate an upper bound of a data valid window $T_{DVW}$ and the second data delay amount may indicate a lower bound of the data valid window $T_{DVW}$. Accordingly, the average of the first and second data delay amounts may indicate a middle position of the data valid window $T_{DVW}$. In turn, when a given $i^{th}$ input data signal DQ(i) is delayed by the average data delay amount to generate an $i^{th}$ delayed data signal DQ(i)_d, and the input data strobe signal DQS is delayed by the reference clock delay amount, the $i^{th}$ delayed data signal DQ(i)_d receives sampling transitions of the delayed data strobe signal DQS_d in target sampling positions. At block 818, the controller 702 may set the delays of the data signals DQ to the target data delay amounts.

Figure 7C:
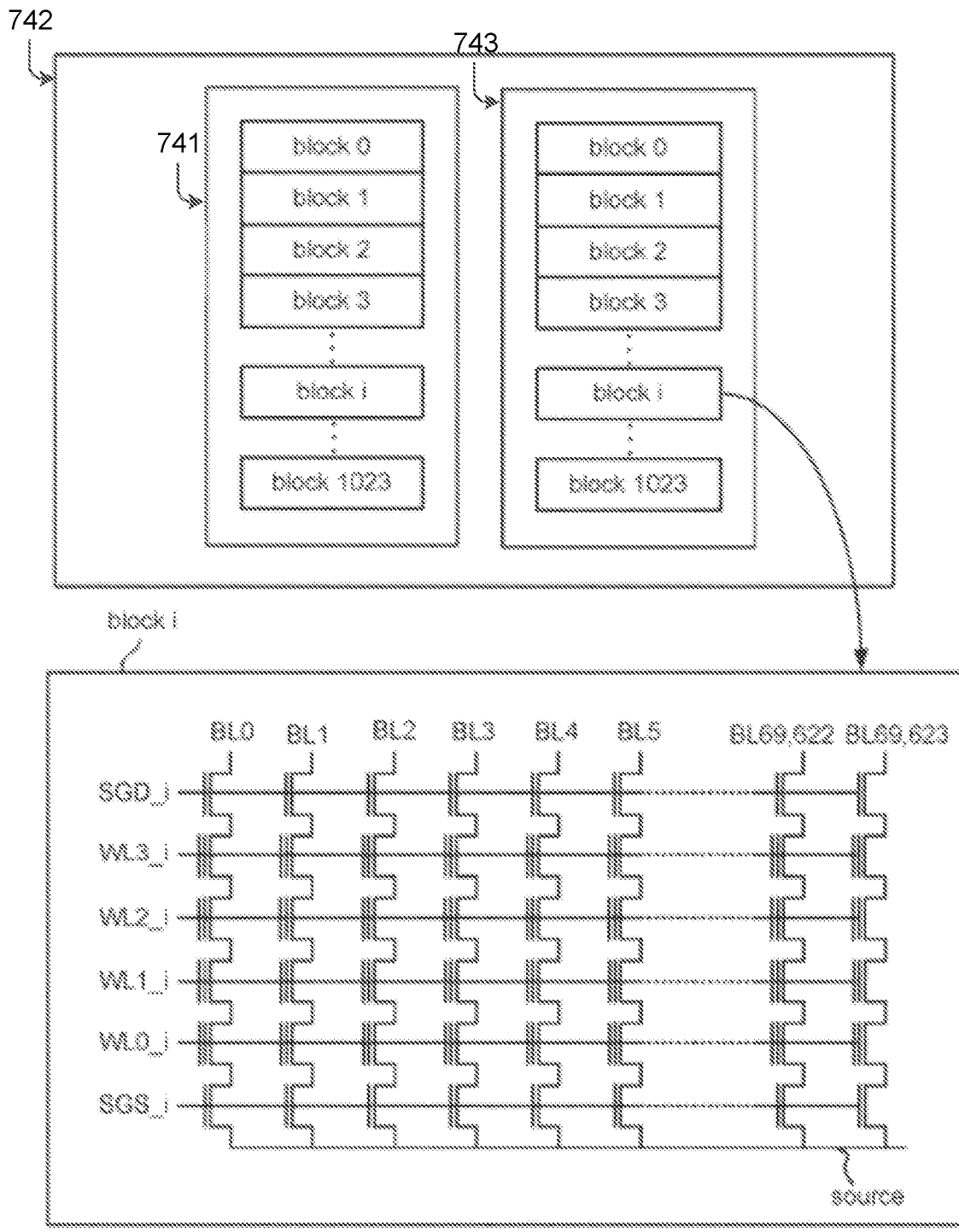
FIG. 7C illustrates a block diagram of an example memory cell structure of FIG. 1B.

FIG. 7C illustrates a block diagram of an example memory cell structure 742. In one embodiment, an array of memory cells is divided into multiple planes. In the example of FIG. 7C, the memory cell structure 742 is divided into two planes: plane 741 and plane 743. In other embodiments, more or less than two planes can be used. In some embodiments, each plane is divided into a number of memory erase blocks (e.g., blocks 0-1023, or another amount). In certain memory technologies (e.g., 2D/3D NAND and other types of flash memory), a memory erase block is the smallest unit of memory cells for an erase operation. That is, each erase block contains the minimum number of memory cells that are erased together in a single erase operation. Other units of erase can also be used. In other memory technologies (e.g., MRAM, PCM, etc.) used in other embodiments implementing the solution claimed herein, memory cells may be overwritten without an erase operation and so erase blocks may not exist.

Each memory erase block includes many memory cells. The design, size, and organization of a memory erase block depends on the architecture and design for the memory cell structure 742. As used herein, a memory erase block is a contiguous set of memory cells that share word lines and bit lines; for example, erase block i of FIG. 7C includes memory cells that share word lines WL0_i, WL1_i, WL2_i and WL3_i and share bit lines BL0-BL69,623.

In one embodiment, a memory erase block (see block i) contains a set of NAND strings which are accessed via bit lines (e.g., bit lines BL0-BL69,623) and word lines (WL0, WL1, WL2, WL3). FIG. 7C shows four memory cells connected in series to form a NAND string. Although four cells are depicted to be included in each NAND string, more or less than four can be used (e.g., 16, 32, 64, 128, 256 or another number or memory cells can be on a NAND string). One terminal of the NAND string is connected to a corresponding bit line via a drain select gate, and another terminal is connected to the source line via a source select gate. Although FIG. 7C shows 69,624 bit lines, a different number of bit lines can also be used.

Each memory erase block and/or each memory storage unit is typically divided into a number of pages. In one embodiment, a page is a unit of programming/writing and a unit of reading. Other units of programming can also be used. One or more pages of data are typically stored in one row of memory cells. For example, one or more pages of data may be stored in memory cells connected to a common word line. A page includes user data and overhead data (also called system data). Overhead data typically includes header information and ECC that have been calculated from the user data of the sector. The controller (or other component) calculates the ECC when data is being written into the array, and also checks it when data is being read from the array. In one embodiment, a page includes data stored in all memory cells connected to a common word line.

In the example discussed above, the unit of erase is a memory erase block, and the unit of programming and reading is a page. Other units of operation can also be used. Data can be stored/written/programmed, read, or erased a byte at a time, 1K bytes, 512K bytes, etc. No particular unit of operation is required for the claimed solutions described herein. In some examples, the system programs, erases, and reads at the same unit of operation. In other embodiments, the system programs, erases, and reads at different units of operation. In some examples, the system programs/writes and erases, while in other examples the system only needs to program/write, without the need to erase, because the system can program/write zeros and ones (or other data values) and can thus overwrite previously stored information.

As used herein, a memory storage unit is the set of memory cells representing the smallest storage unit of operation for the memory technology to store/write/program data into the memory cell structure 742. For example, in one embodiment, the memory storage unit is a page sized to hold 4 KB of data. In certain embodiments, a complete memory storage unit is sized to match the number of physical memory cells across a row of the memory cell structure 742. In one embodiment, an incomplete memory storage unit has fewer physical memory cells than a complete memory storage unit.

Figure 7D:
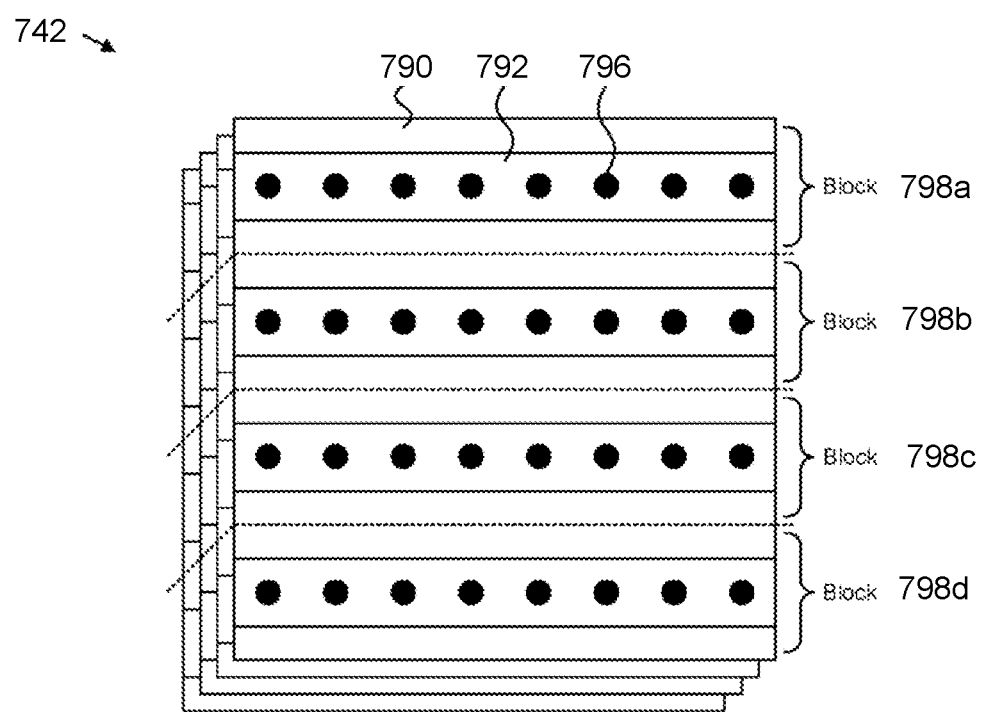
FIG. 7D is a schematic block diagram illustrating one embodiment of a memory cell structure of FIG. 7B.

FIG. 7D depicts one embodiment of a memory cell structure 742. In various embodiments, the memory cell structure 742 may be substantially as described above with regard to FIG. 7B. In the depicted embodiment, the memory cell structure 742 includes word line layers 790, word lines 792, and memory cells 796, organized in blocks 798.

In various embodiments, a memory cell 796 may refer to any component with a physical property that may be altered to store data. For example, a memory cell 796 for NAND memory may be a floating gate transistor, for which the threshold voltage (corresponding to an amount of stored charge on the floating gate) may be altered to store data. Similarly, a memory cell 796 for magnetoresistive memory may be a magnetic tunnel junction, for which a resistance (corresponding to whether two magnetic layers are in parallel or antiparallel states) may be altered to store data. Various types of memory cells 796 for various types of non-volatile memory, such as ReRAM, PCM, MRAM, NAND, and the like, will be clear in view of this disclosure.

In the depicted embodiment, the memory cell structure 742 is a three-dimensional non-volatile memory array. In various embodiments, a three-dimensional non-volatile array may refer to any memory cell structure 742 that includes multiple layers of memory cells 796. Each layer of memory cells 796 may include a plurality of rows and columns of memory cells 796, or another two-dimensional arrangement of memory cells 796.

In various embodiments, word lines 792 may be metal (or other conductive) lines that connect a plurality of memory cells 796. For example, in a two-dimensional array, word lines 792 may connect rows of memory cells 796, and bit lines may connect columns of memory cells 796. In a two-dimensional array, writing may involve applying a write voltage to a word line 792 for a row, while applying program or inhibit voltages to individual bit lines, to control which cells 796 of the row are programmed. Similarly, reading may involve applying a read voltage to a word line 792 for a row, and sensing bit line voltages or currents to determine the state of individual cells 796 in the row. As for a two-dimensional array, reading and writing to memory cells 796 of a three-dimensional memory cell structure 742 may involve transferring a bias voltage (e.g., a read or write voltage) to a word line 792 that connects to multiple cells 796, while addressing individual cells 796 via bit lines. In a certain embodiment, a bit line for a three-dimensional memory cell structure 742 may vertically couple cells 796 in different layers, so that a bit line current or voltage can be sensed above or below the layers. In a further embodiment, local bit lines may extend through the layers to couple cells 796 in different layers, and may be coupled to global bit lines above or below the memory cell structure 742.

In the depicted embodiment, word line layers 790 include the word lines 792. In various embodiments, a layer may refer to a substantially flat structure formed or deposited over a substrate (or over another layer). A word line layer 790, in further embodiments, may refer to a layer that comprises (or is) one or more word lines 792. In certain embodiments, the word line layers 790 may include the word lines 792 and memory cells 796. For example, 3D NAND memory cells 796 may be formed by depositing alternating conductive and insulating layers, forming vertical holes through the layers, depositing charge trap material on the walls of the holes, and forming a central conductor through the holes, so that each conductive layer is a word line 792, and the charge trap material where a hole intersects a word line 792 is a memory cell 796. In another embodiment, a layer of MRAM memory cells 796 may be formed, and then a word line layer 790 may be deposited on top of the layer of memory cells 796, so that word lines 792 are above the memory cells 796.

In one embodiment, a word line layer 790 may be a word line 792. For example, in a certain embodiment, a word line layer 790 may be a conductive layer that connects to multiple memory cells 796. In another embodiment, a word line layer 790 may include multiple word lines 792. For example, in the depicted embodiment, a word line 792 connects to a row of memory cells 796, and each word line layer 790 includes multiple word lines 792, so that a stack of rows forms a block 798. In one embodiment, block 798 *a* may be addressed using the first word line 792 in each word line layer 790, block 798 *b* may be addressed using the second word line 792 in each word line layer 790, and so on. In the depicted embodiment, linear word lines 792 are coupled to individual rows of memory cells 796. In another embodiment, however, a first comb-shaped word line 792 may be coupled to odd rows, and a second comb-shaped word line 792 may be coupled to even rows. Various configurations of word lines 792 within a word line layer 790 will be clear in view of this disclosure.

In various embodiments, word lines 792 and bit lines are coupled to peripheral circuitry (not shown in FIG. 7D) for reading and writing data of the memory cells 796 and writing data to the memory cells 796. In general, in various embodiments, peripheral circuitry may include control components that control word line voltages and bit line voltages, latches for temporarily storing data of a read operation or a write operation, sense amplifiers to detect and amplify bit line voltages or currents, and the like.

Figure 9:
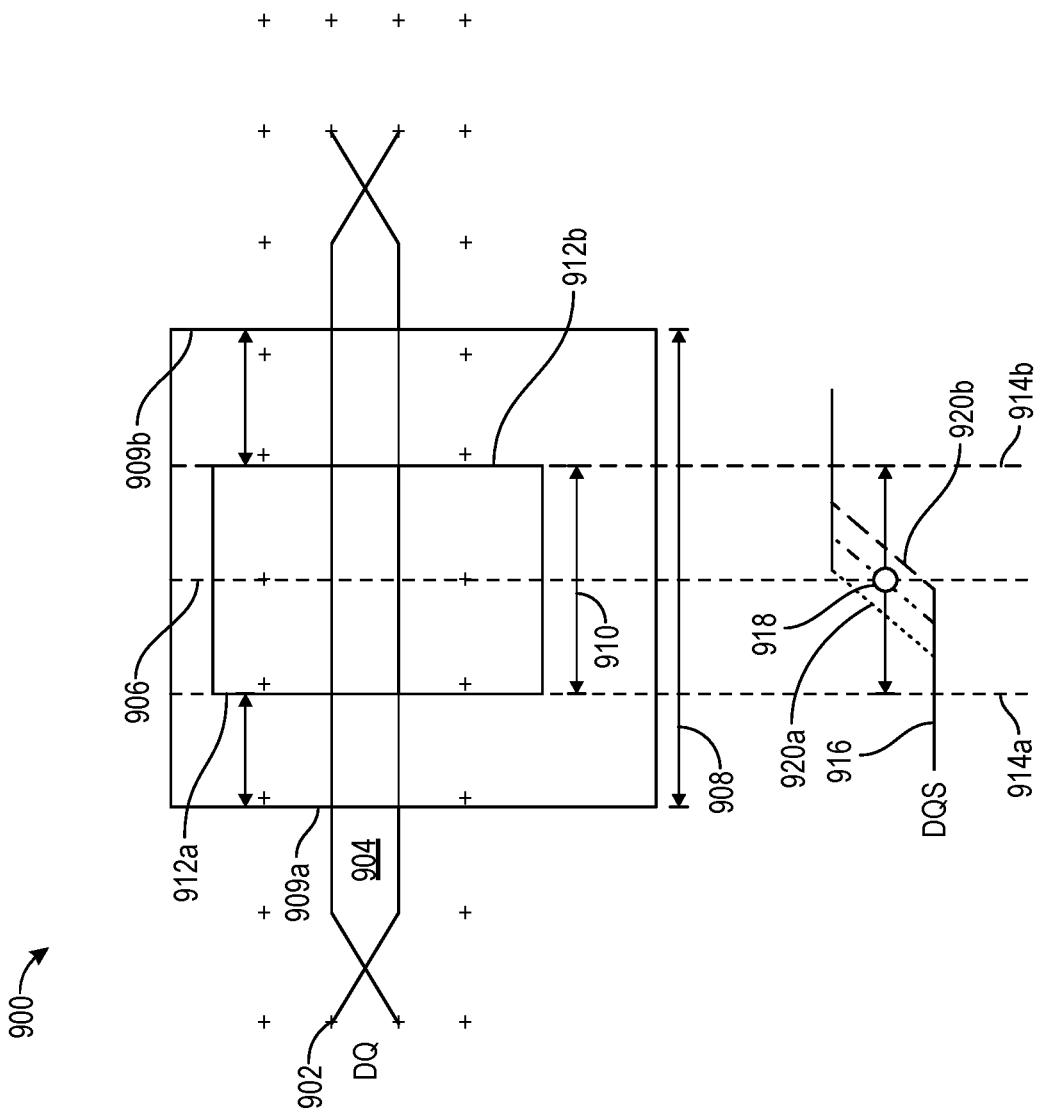
FIG. 9 illustrates a data eye diagram having limit and passing windows laid thereon and that describes various features of example embodiments described in the present disclosure.

FIG. 9 illustrates a data eye diagram 900 having minimum threshold window 910 and passing window 908, overlaid thereon and that depicts various features of interface training validation (IFTV) process performed by example embodiments described in the present disclosure. The various elements regularly spaced apart in the data eye diagram 900 represent delay resolution.

The data eye diagram 900 is represents a data signal 902, which has a corresponding data window 904 (e.g., a valid data window as described above). The data window 904 may represent one of a data window for an even or odd data pulse of the data signal 902. The data window 904 may include a center position 906. FIG. 9 also includes a data strobe signal 916 having a rising edge 918 (e.g., sampling transition). Thus, the center position 906 may represent an optimal or ideal position or time (referred to herein as "ideal time") in the data window for sampling the data pulse via data strobe signal 916, such that data operations that occur or are triggered via the rising edge 918 at the center position 906 have maximized or sufficiently large setup and hold periods and margins. Sufficiently large or maximized may refer to parameters defined by the specifications of the system for correct and accurate sampling of the data eye window 904, because data eye windows (such as data eye window 904) are affected by the environment in which the system is present. The center position 906 may be determined during an initial training of the memory interface using, for example, a write training process (such as the method 800 of FIG. 8). A controller, such as the controller 92, may use the IFTV process disclosed herein to determine whether an initial training of the memory interface needs to be updated or recalibrated with a retraining. Retraining may comprise executing the write training process again to align the rising edge of the data strobe signal with the center position of the data pulse.

For example, the controller may use the initial training of the memory interface to identify the center position 906. As discussed above, the controller may identify the center position 906 based on write training. Accordingly, the controller may place the rising edge 918 of the data strobe signal 916 at different times within the data window 904 until the controller identifies the center position 906, at which time the setup and hold times and/or corresponding margins are substantially equal and/or maximized. In some embodiments, the setup and hold times and/or corresponding margins maybe substantially equal and/or maximized where they are equal on a picosecond scale (e.g., +/−100 picoseconds, +/−50 picoseconds, +/−10 picoseconds, etc. of each other). For example, the write training process may include placing the sampling transition of the clock signal DQS/DQSB at a first location or timing within the data window 904 and determining whether the setup and hold times for the data signal 902 are maximized. The write training process may repeat this for various timing increments in the data window 904 and then compare setup and hold times for each timing. The write training may select the timing that maximizes the setup and hold times, which may substantially center the rising edge 918 of the data strobe signal 916 in the data window 904. For example, the controller may place the data strobe signal 916 at a farthest left timing in the data window 904. The controller may then execute a data operation and determine lengths of the setup and hold times. The controller then incrementally shifts the data strobe signal 916 to various timings to the right of the farthest left timing (e.g., toward the center position 906), executes data operations at each timing, and determines lengths of the setup and hold times for each timing. The controller may then identify the ideal timing (e.g., center position 906) for the data strobe signal 916 based on which timing of the data window 904 provides the setup and hold times that are maximized from all of the timing and setup and hold time associations.

Alternatively, the controller may identify the ideal timing of the data strobe signal 916 at the using other methods. For example, the ideal time of the data strobe signal 916 may correspond to a timing substantially at which corresponding odd and even data windows (e.g., associated with the data window 904) have substantially the same or similar lengths.

From such initial training, the data strobe signal 916 may be positioned approximately at a center of the data window 904, as shown in the data eye diagram 900. The substantial center of the data window 904 may correspond to a substantially ideal time in the data window 904 at the time of the initial training.

Based on the ideal timing of the data strobe signal 916, the controller may employ the IFTV process to determine whether the memory interface needs to be retrained due to detecting an occurrence of variations in one or more of the duty cycle of the DQS/DQSB signal, the duty cycle of the DQ signal, or changes in the delay value tDQS2DQ. Employing the IFTV process may comprise a number of steps after the initial training to check whether any PVT, which may have caused the data strobe signal 916 to drift so to occur at a timing that is not the ideal timing or is outside an acceptable minimum limit of the ideal timing. A non-ideal timing of the data strobe signal 916 may correspond to a timing in the data window 904 where the setup and hold periods and margins of the data window 904 are not maximized, thereby resulting in data operation failures (e.g., hold and/or setup violations). Additionally, the non-ideal timing of the data strobe signal 916 may correspond to a times at which data operations will be unsuccessful. Conversely, a passing window 908, described in further detail below, may be identified the corresponds to timings of the data strobe signal 916 at which the data operations will generally be or are expected to be successful. For example, as the timing of the data strobe signal 916 drifts or shifts beyond the minimum threshold window 910 from the center position 906, data operations that occur according to the data strobe signal 916 may be less successful, potentially resulting in poor or undesirable outcomes. At a certain point, data operations occurring at timings farther and farther from the center position 906, in either direction of time, will be unsuccessful, thereby defining the passing window 908 (e.g., a window in which data operations pass or are successful). Thus, based on identifying the passing window 908 in relation to the minimum threshold window 910, the IFTV process may identify the occurrence of one or more variances and determine whether the timing of the data strobe signal 916, after the variances, requires retraining of the memory interface to avoid or rectify poor or undesirable outcomes caused by less successful data operations.

The IFTV process includes establishing the minimum threshold window 910. The minimum threshold window 910 is defined between minimum limit 912*a* (also referred to herein as a minimum timing limit) and a maximum limit 912*b* (also referred to herein as a minimum timing limit). The minimum threshold window 910 may represent minimum timings thresholds from the center position 906, for example, corresponding to a threshold amount of drift or shift in the data strobe signal 916 permitted before data operations become a concern and may require retraining. The minimum threshold window 910 identifies a minimum range timings of the data strobe signal 916, on either side of the center position 906, that result in successful data operations. While timings of the data strobe signal 916 outside of the minimum threshold window 910 may result in successful data operations, the minimum threshold window 910 represents those timings that must result in successful data operations. In some embodiments, a user may establish or otherwise set the minimum and maximum limits 912*a* and 912*b* to define the minimum threshold window 910. The minimum and maximum limits 912*a* and 912*b* may be set in advance or otherwise set after the initial training and/or after detection of a PVT variation. In some embodiments, the minimum and maximum limits 912*a* and 912*b* may be equal in value but in opposite directions with respect to the center position 906, as shown in FIG. 9. In another embodiment, the minimum and maximum limits 912*a* and 912*b* need not be equal in value with respect to the center position 906, as long as the center position 906 is between the minimum and maximum limits 912*a* and 912*b*.

After the initial training of the memory interface, the IFTV process may comprise determining minimum passing window boundary 909*a* and a maximum passing window boundary 909*b* defining the passing window 908. The passing window boundaries 909*a* and 909*b* may identify timings of the data strobe signal 916, of the data window 904 on either side of the center position 906 within the passing window 908, that do not encroach upon the setup and hold periods and margins of the data window and that may result in successful data operations (e.g., timings of the DQS signal that do not result in setup or hold violations). Thus, timings within the passing window 908 are those timings of the data strobe signal 916 that result in successful data operations, while timings outside of the passing window 908 are those timings that result in unsuccessful data operations. The IFTV process may determine the passing window boundaries 909*a* and 909*b* based on applying a two-point sampling check. The two-point sampling check may determine whether the memory interface needs to be retrained, for example, by incrementally shifting the data strobe signal 916 earlier in time and later in time, relative to the data window 904, and performing test data operations (e.g., test samplings) at each incremental location until an unsuccessful data operation (e.g., failure) occurs. A position at which an unsuccessful data operation occurs earlier in time (e.g., an advanced data strobe signal 916) establishes the minimum passing window boundary 909*a* and a position at which an unsuccessful data operation occurs later in time (e.g., a delay data strobe signal 916) establishes the maximum passing window boundary 909*b*. For example, as part of the IFTV process, the controller may incrementally shift the rising edge of the data strobe signal, starting at the center position 906, toward the minimum limit 912*a*, as shown by advanced offset 920*a*. In various embodiments, the controller may determine a data operation is successful or not based on the specifications of the system. Similarly, the controller may incrementally shift the rising edge of the data strobe signal, starting at the center position 906, toward the maximum limit 912*b*, as shown by delayed offset 920*b*. The controller performs a data operation at each incremental timing of the advanced offset 920*a* and delayed offset 920*b* and determines whether each data operation is successful or unsuccessful. In some embodiments, the two offsets are incrementally shifted of equal value but of opposite sign, such that the two-point training check involves data strobe signals that are substantially equidistant from the center position 906 (e.g., one to the left and one to the right of the center position 906). In some embodiments, the two offsets may not be equal in value but in opposite directions with respect to the center position 906. In some embodiments, the shifting of the offsets 920*a* and 920*a* may be performed simultaneously. In some embodiments, one offset may be shifted, and data operations performed prior to shifting the other offset. For example, the advanced offset 920*a* may be shifted until an unsuccessful data operation is identified and then the delayed offset 920*b* may be shifted. The two point sampling check identifies two points 914*a* and 914*b* at which unsuccessful data operations occur (e.g., a point of each unsuccessful data operation in both direction from the center position 906), and the timings corresponding to the unsuccessful data operations establish the minimum passing window boundary 909*a* and the maximum passing window boundary 909*b*.

Once the two points 914*a* and 914*b* for the sampling are determined (e.g., after the two point sampling check), the two points 914*a* and 914*b* (e.g., minimum passing window boundary 909*a* and the maximum passing window boundary 909*b*) are compared to the minimum limit 912*a* and a maximum limit 912*b*, respectively. Where either of the two are within the minimum threshold window 910, the controller identifies an occurrence of a variance in the data strobe signal 916 relative to the data signal 902 (e.g., an occurrence of variations in one or more of the duty cycle of the DQS/DQSB signal, the duty cycle of the DQ signal, or changes in the delay value tDQS2DQ), indicating that the IFTV has failed and that the data strobe signal 916 needs to be retrained. That is, the controller may determine that one or both of the passing window boundaries 909*a* and/or 909*b* are less than, or inside, the limits 912*a* and/or 912*b*, respectively, which indicates the need for retraining. Where the controller determines that the passing window boundaries 909a and 909b are both greater than, or outside, the limits 912a and 912b, respectively, the controller may determine that retraining is not yet needed. Where the controller determines that the limits 912a and 912b are equal to the passing window boundaries 909a and 909b, respectively, the controller may provide options for retraining the data strobe signal 916 or delaying retraining until a later time. The selection between retraining or delaying retraining may be presented to a user or made by the controller based on one or more parameters.

In summary, using the passing window and minimum threshold window 908 and 910 as examples, after detecting a PVT variation or a duty cycle variation, the controller may determine whether the detected variation requires retraining the memory interface to recalibrate the data strobe signal 916 with respect to the data signal 902 (e.g., align the rising edge of the data strobe signal 916 with the center position 906 of the data signal 902). This determination may comprise execution of the IFTV process to determine a need to retrain the memory interface (thereby resulting in recalibration of the data strobe signal 916). The IFTV process may establish the passing window 908, based on data operation failures resulting from advanced and delayed offsets applied to the rising edge of the data strobe signal 916. The IFTV process then compares the passing window 908 to the minimum threshold window 910 to detect a variation in one or more of the duty cycle of the data signal 902, the duty cycle of the data strobe signal 916, and the delay value tDQS2DQ. Where at least one of the sample points 914a and 914b (e.g., the passing window boundaries 909a and/or 909n) is closer to the center position 906 than the minimum limit 912a or the maximum limit 912b, respectively, (e.g., at least one sample point falls inside the minimum threshold window 910), the memory interface needs retraining. Where both of the sample points 914a and 914b are further from the center position 906 than or equal to the limits 912a and 912b (e.g., both sample points fall outside or on the minimum threshold window 910), the memory interface does not need retraining. In some embodiments, where the sample points 914a and 914b fall on or a combination of on and outside the limits 912a and 912b, the controller may selectively retrain the memory interface. As shown in the illustrative example of the data eye diagram 900, the sample points 914a and 914b are both on the minimum threshold window 910. Thus, the controller applying the IFTV process to the shown values may determine that retraining is not needed for the memory interface, but retraining may be provided as an option.

Figure 10:
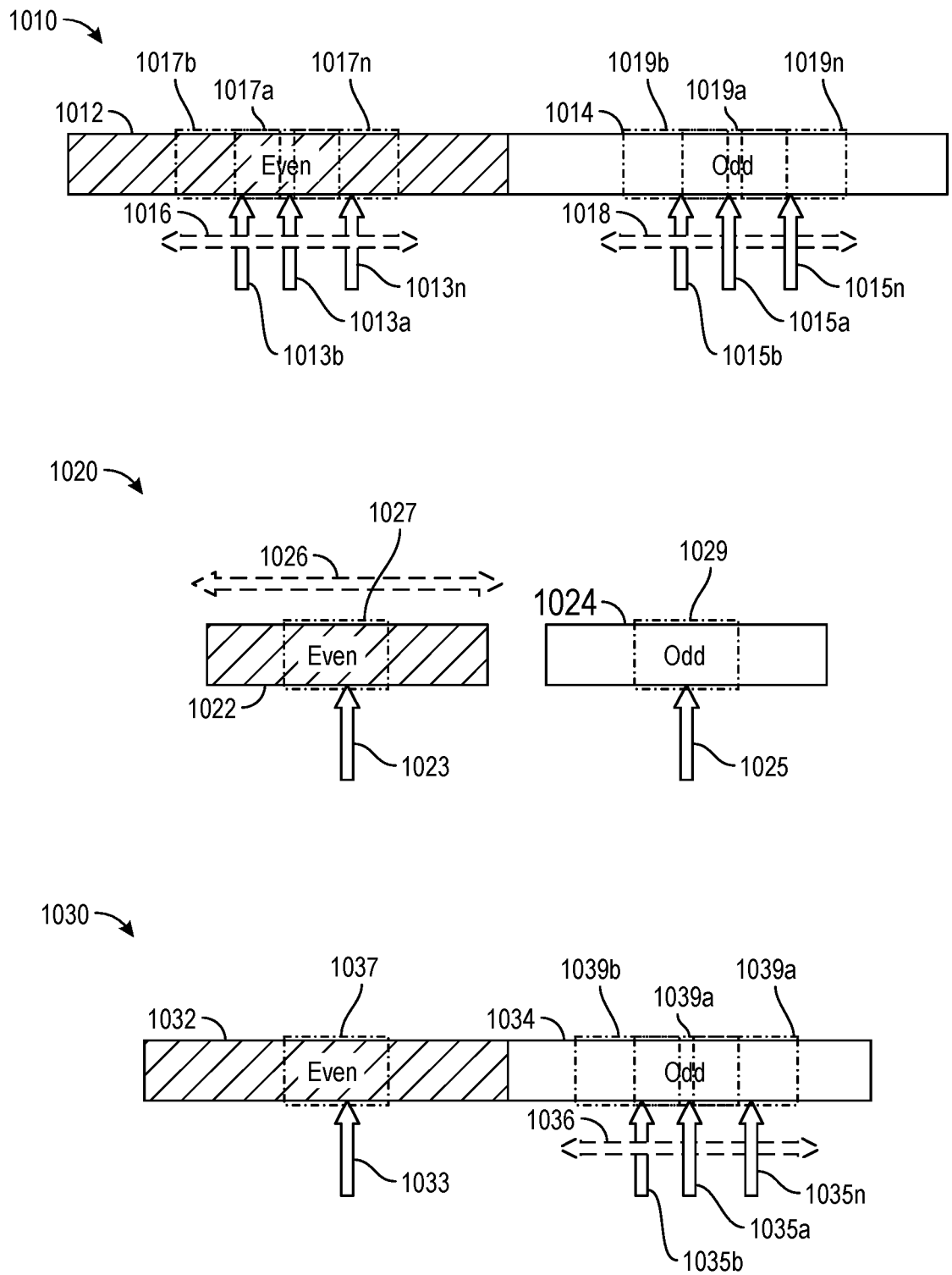
FIG. 10 illustrates a number of example errors or variations that can be detected using example embodiments described in the present disclosure.

FIG. 10 illustrates a number of example errors or variations that can be detected using example embodiments of the IFTV process described in the present disclosure.

A first data block diagram 1010 shows that the disclosed technology may identify or detect an occurrence of a change in the delay value tDQS2DQ introduced above. For example, the first data block diagram 1010 shows an even data block 1012 and an odd data block 1014. The first data block diagram 1010 further includes arrows 1013a-n representing a rising edge (e.g., a sampling transition) of a data strobe signal DQS placed at a location or time in the even data block 1012. The first data diagram 1010 also includes arrow 616, which represents changes in location or times in the even data block 612 of the rising edge of the data strobe signal DQS based on shifts (e.g., drift or skew) in the data strobe signal DQS due to one or more PVT or other variations experienced by or in a corresponding clock tree. Arrows 1013a-n represent various locations or times that the rising edge of the data strobe signal DQS as a result of the variations represented by arrow 1016. Similarly, arrows 1015a-n represents a rising edge of a data strobe signal DQS placed at a location or time in the odd data block 1014. Arrow 1018 represents changes in location or times in the odd data block 1014 of the rising edge of the data strobe signal DQS based on shifts (e.g., drift or skew) in the data strobe signal DQS due to the one or more of PVT or other variations experienced by or in the corresponding clock tree. Arrows 1015a-n represent various locations or times that the rising edge of the data strobe signal DQS as a result of the variations represented by arrow 1018. Example minimum threshold widows 1019a-n and 1017a-n for each data strobe signal are also provided. Shifts in the data strobe signal DQS/DQSB relative to the corresponding data block may translate to changes in the delay value tDQS2DQ. For example, while a given PVT variation may cause a change in the delay value tDQS2DQ, this PVT variation may also affect alignment of the duty cycle of the data strobe signal DQS/DQSB with the valid data window of the data signal DQ.

A second data block diagram 1020 shows how the disclosed technology may detect the data strobe signal DQS/DQSB duty cycle variations introduced above. For example, the second data block diagram 1020 shows an even data block 1022 and an odd data block 1024. The second data block diagram 1020 further includes arrow 1023 representing, for example, a rising edge of the data strobe signal DQS that may be placed at a location or time in the even data block 1022, represented by arrow 1026. For the odd data block 1024, arrow 1025 may represent rising edges of the data strobe signal DQSB, where variations in the duty cycle of the data strobe signal DQS/DQSB may cause the rising edge of the data strobe signal DQSB to be placed at different locations or times in the odd data block 1024. Example minimum threshold widows 1029 and 1027 for each data strobe signal are also provided. These variations in the rising edge of the data strobe signal DQSB may be caused by data strobe signal DQS/DQSB duty cycle variations.

A third data block diagram 1030 shows how the disclosed technology may detect the data signal DQ duty cycle variations introduced above. Specifically, the third data block diagram 1030 shows an even data block 1032 and an odd data block 1034. The third data block diagram 1030 further includes arrow 1033 representing, for example, a rising edge of the data strobe signal DQS that may be placed at a location or time in the even data block 1032. Arrow 1036 shows how the data signal DQ duty cycle may experience variations, which may cause a size or length of the odd data block 1034, for example, to change. Example minimum threshold widows 1039a-n and 1037 for each data strobe signal are also provided. Similarly, though not shown explicitly in the third data block diagram 1030, the data signal DQ duty cycle variations may cause a size or length of the even data block 1032 to change. Such variations in the duty cycle of the data signal DQ and, thus, sizes of the even/odd data blocks 1032 and 1034 may cause the rising edges of the data strobe signal DQS/DQSB to be placed at different locations or times in corresponding the even/odd data blocks 1032 and 1034.

As shown in the data block diagrams 1010, 1020, and 1030, any of the PVT variations, data signal DQ duty cycle variations, or the data strobe signal DQS/DQSB duty cycle variations can cause the position of the data strobe signal DQS/DQSB to vary relative to and within the corresponding data block. These kinds of changes may impact data operations performed with or on the memory die. For example, data reads and/or writes may fail because the data strobe signal DQS/DQSB is received too early or too late in the corresponding data window because of the data signal DQ duty cycle variation, the data strobe signal DQS/DQSB duty cycle variation, and/or the tDQS2DW. Systems and methods executing the IFTV process disclosed herein can detect such failures and retrain the memory interface as appropriate to correct the timing of the data strobe signal DQS/DQSB to be substantially ideal with respect to the corresponding even/odd data block of the data signal DQ. As introduced above, the substantially ideal timing or position of the data strobe signal DQS/DQSB may be substantially centered in the corresponding even/odd data block, where, when substantially centered, the setup and hold times and margins of the even/odd data block are substantially maximized and equal. Further details are provided below.

Accordingly, embodiment disclosed herein are able to detect variations in the duty cycle of the DQ and/or DQS/DQSB signal, along with variations in the tDQS2DQ, because the minimum threshold window is changed by the DQS/DQ duty. Whereas, the oscillator circuit of FIG. 3 is unable to detect variations in the duty cycles, because the oscillator circuit is only able to detect delay variations, as described above.

Figure 11:
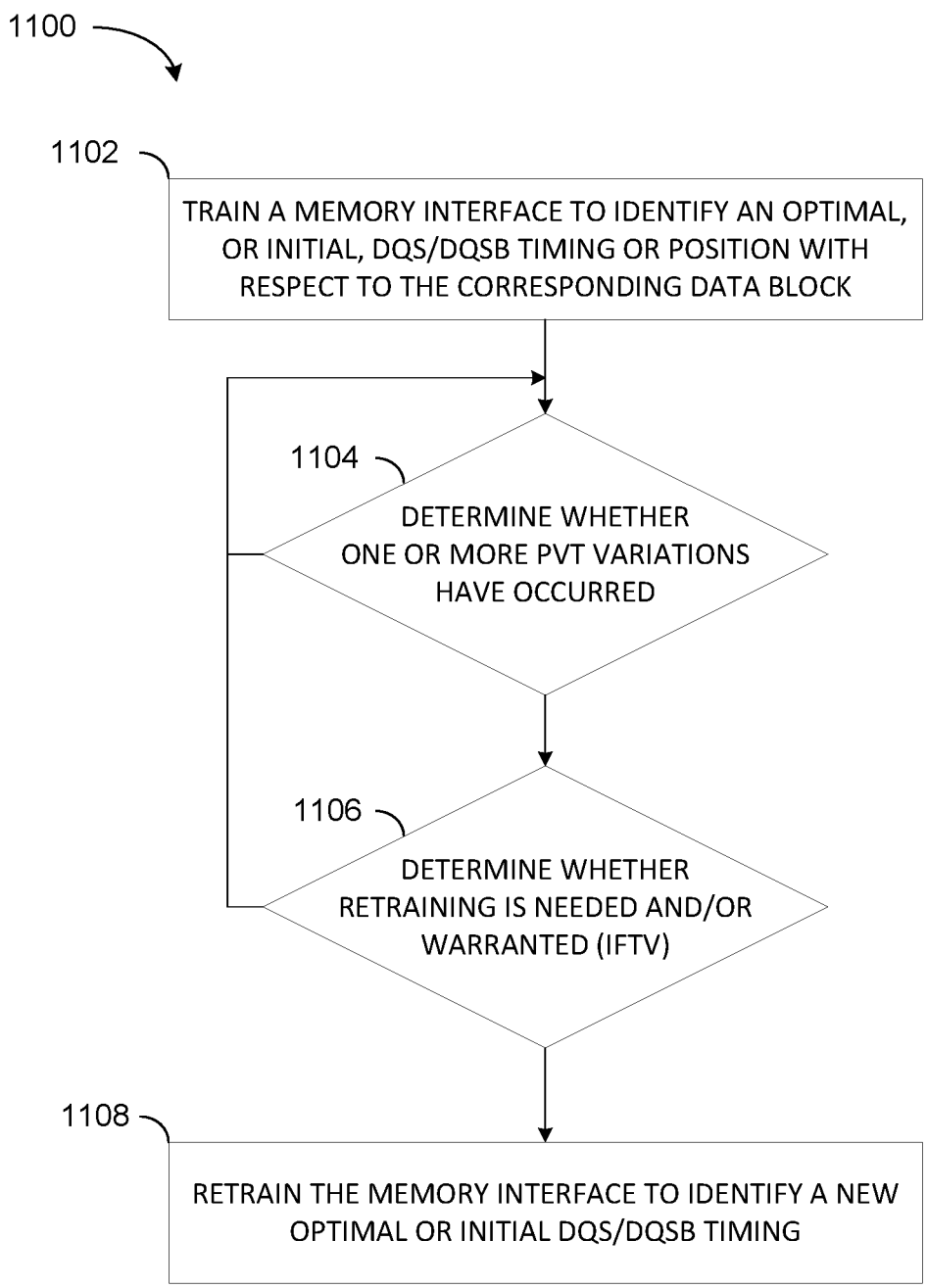
FIG. 11 depicts an example flow chart for a method of determining a need to retrain a memory interface, according to example embodiments described in the present disclosure.

FIG. 11 depicts an example flow chart for a method 1100 of determining a need to retrain a memory interface, according to example embodiments described in the present disclosure. The method 1100 may comprise additional or fewer operations than shown in FIG. 11, or the operations shown may be performed in a different order than shown. A controller, such as the controller 102, may perform the operations or steps of the method 1100.

FIG. 11 shows example steps that can be performed by the controller 702 (or an external controller or the memory interface 730, separate from or part of the controller 702) configured to coordinate data operations with a memory cell, such as a memory cell of the memory cell structure 742. For example, the controller 702 can fetch, decode, and/or execute one or more instructions for performing various steps of the method 1100. Various instructions (e.g., for performing one or more steps described herein) can be stored in non-transitory storage medium of controller 702 and/or control logic circuitry of peripheral circuit 752. As described in detail below, machine-readable storage medium of controller 702 may be encoded with executable instructions, for example, instructions for executing steps of the method 1100.

In a first operation 1102, the method 1100 comprises training a memory interface to identify an optimal, or initial, DQS/DQSB timing or position with respect to the corresponding data block. For example, with respect to the data eye diagram 900, the training of the DQS/DQSB timing or position may comprise identifying the ideal timing of the DQS/DQSB signal (e.g., data strobe signal 916) in the data window 904 (e.g., center position 906). In some embodiments, as described above, the training of the memory interface may comprise using the write training process (e.g., as described above in connection with FIG. 8) to, for example, identify the ideal timing of the DQS/DQSB signal that maximizes setup and hold periods and margins in the data window 904. In some embodiments, the training of the memory interface comprises identifying the DQS/DQSB signal timing that ensures that corresponding even/odd data blocks are of substantially similar, or the same, sizes or lengths.

After the initial data strobe signal timing relative to the data window is identified, the controller may determine whether one or more PVT. Determining whether any PVT variation has occurred may comprise monitoring for PVT variations. Such monitoring may comprise monitoring for process changes, environmental sensors, signal changes, and so forth. Any PVT variation may cause a variation to one or more of the data strobe signal DQS/DQSB (such as timing of individual signals or fluctuations in the duty cycle. In some embodiments, the duty cycle variations are not created by the PVT variations but by other variations (such as control changes, etc.). PVT variations may result in a change in the sampling window of the data signal (e.g., data signal 902). Thus, in some embodiments, PVT variations may be detected using sampling method similar to that described in connection with FIG. 9. In some embodiments, the PVT variation is compared to a threshold variation value to determine whether the PVT variation is sufficiently large to check if retraining is needed. In some embodiments, the threshold variation value may be user established or controller established. In an example, the threshold variation value may be, for example, +/−3%, which may be variation permitted within an internal path of a memory system (e.g. memory system 700).

If the controller determines at operation 1104 that the PVT variation exceed the threshold variation value or otherwise determines that a retraining check is warranted, then the method 1100 may proceed to operation 1106. If the controller determines that the PVT variations do not exceed the threshold variation value or that a retraining check is not yet needed, then the method 1100 may repeat the monitoring and determining associated with operation 1104.

At operation 1106, the controller may determine whether retraining is needed or warranted. Determining whether retraining is needed may comprise applying the IFTV process, as described above in connection with FIG. 9, to determine identify or detect a variation in one or more of the duty cycle of the DQS/DQSB, duty cycle of the DQ and a change in the delay value tDQS2DQ. That is, at operation 116, a determination is made whether a current DQS/DQSB signal timing relative to the data window, which has been changed since the initial training of the memory interface to a point that retraining of the memory interface is warranted. For example, any of the delay value tDQS2DQ variation and/or the DQS/DQSB signal and/or DQ signal duty cycle variation may change a timing of the DQS/DQSB signal relative to the data window. When the variation changes the DQS/DQSB signal timing such that any data operation that previously fell within a passing window defined about the ideal timing now falls outside the passing window, the controller may determine that retraining of the memory interface may be warranted. The controller, thus, may determine whether retraining is warranted pursuant to the IFTV process described above with reference to FIG. 9. Thus, as PVT and duty cycle variations cause the DQS/DQSB signal to drift further from the initially trained ideal timing of the DQS signal, the controller may determine whether data operations at timings around the shifted/drifted DQS/DQSB signals may result in increased failures and retrain the memory interface as needed. When retraining is determined to be needed, the method 1100 proceeds to operation 1108. When retraining is not determined to be needed, the method 1100 repeats from operation 1104.

For example, at operation 1106, the DQS signal may be incrementally advanced and/or delayed to a plurality of timings prior to and after the ideal timing for the data window of the data signal DQ. For each incremental timing, a data operation is performed to identify unsuccessful data operations, one in both directions of the ideal timing. The timing positions for the unsuccessful data operations are then compared to a minimum limit and a maximum limit, in either direction of the ideal timing. For example, an unsuccessful data operation of an advanced DQS signal is compared to the minimum limit, while an unsuccessful data operation of a delayed DQS signal is compared to the maximum limit. In the event that either unsuccessful data operation is closer to the ideal timing than the respective limit, operation 1106 proceeds to operation 1108 (e.g., determines retraining is needed). In the event that both unsuccessful data operations are further from the ideal timing than the respective limit, operation 1106 determines retraining is not needed and repeats operation 1104. In the event that either (or both) of the unsuccessful data operations is equal to the respective threshold, the operation 1106 may proceed to operation 1108 or repeat operation 1104. That is, the decision to retrain or not may be optional and, in some embodiments, provided to a user to decide.

At operation 1108, when retraining is determined to be needed at operation 1106 (or selected by a user in certain embodiments), the controller may retrain the memory interface to identify a new optimal or ideal DQS/DQSB signal timing with respect to the data signal DQ while accounting for the PVT and/or other variations identified over time. For example, the write training process, as described in connection with FIG. 8, is performed to retrain the memory interface. As additional time passes and the memory system experiences additional PVT variations, the controller may repeat method 1100 to continuously or additionally retrain the memory interface to maintain an optimal DQS/DQSB timing with respect to any variations experienced and the data window.

Figure 12:
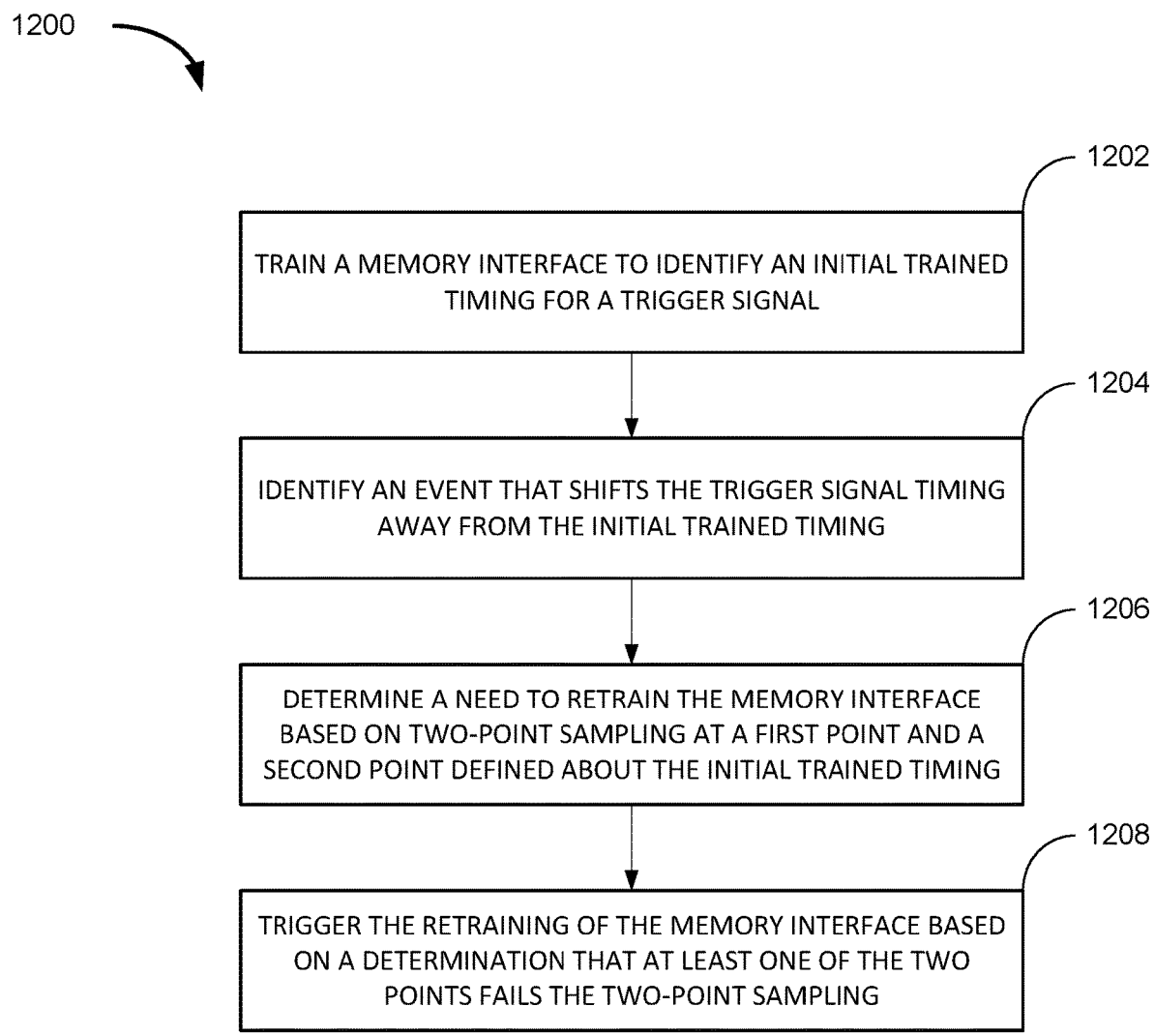
FIG. 12 shows example steps of a method that can be performed for the implementation of various features of embodiments described in the present disclosure.

FIG. 12 shows example steps that can be performed by the controller 702 (or an external controller or the memory interface 730, separate from or part of the controller 702) configured to coordinate data operations with a memory cell, such as the memory cell structure 742. For example, the controller 702 can fetch, decode, and/or execute one or more instructions for performing various steps of the method 1200. Various instructions (e.g., for performing one or more steps described herein) can be stored in non-transitory storage medium of controller 702 and/or control logic circuitry of peripheral circuit 752. As described in detail below, machine-readable storage medium of controller 702 may be encoded with executable instructions, for example, instructions for executing steps of the method 1200.

The method 1200 may comprise a method of coordinating data operations with a data signal of a memory cell, such as a memory cell of the memory cell structure 742 of the memory die 704. Operations that make up the method 1200 can include an operation 1202 at which the controller trains a memory interface. Training the memory interface may comprise determining a trigger signal timing in a data window formed by a data signal in a memory cell. The trigger signal timing may identify an initial trained timing in the data window at which a setup portion (e.g., a setup time) and a hold portion (e.g., a hold time) of the data window are substantially equal in length when the trigger signal is received at the initial trained timing. As used herein, trigger signal may refer to a data strobe signal, such as a DQS signal or data strobe signal 916. Thus, the training of the memory interface 730 may result in identification of the ideal timing of the DQS signal (e.g., data strobe signal 916) in the data window 904, with reference to FIG. 9, as described above.

At step 1204 of the method 1200, the controller identifies an event that shifts the trigger signal timing away from the initial trained timing. This event may comprise one or more PVT variations, as introduced above. Identification of the event may utilize one or more environmental signal monitors or sensors.

At step 1206 of the method 1200, the controller determines a need to retrain the memory interface based on two-point sampling, for example, as described above, at a first point and a second point defined in either direction of the initial trained timing. If either of the first point or the second point fails the two-point sampling (e.g., is within a minimum threshold limit), a retraining of the memory interface is triggered. This determining of the need to retrain the memory interface may correspond to the discussion provided above with reference to FIGS. 9 and 11.

At step 1208 of the method 1200, the controller triggers the retraining of the memory interface based on a determination that at least one of the two points fails the two-point sampling.

In some embodiments, the controller establishes a first set of passing boundaries identifying timing within which a trigger signal will trigger unsuccessful data operations and identifies a second set of minimum limits indicating a minimum offset from the initial trained timing of the trigger signal.

In some embodiments, the controller may be configured to determine a need to retrain the memory interface based on two-point sampling. The two-point sampling comprises the controller being configured to identify a single offset, indicative of an error or variation in a data strobe signal with respect to a data signal, based on the minimum offset. The controller may be configured to determine a need to retrain the memory interface based on two-point sampling further comprises the controller being configured to apply the single offset to the initial trained timing of the trigger signal by defining the first point and the second point about the initial trained timing. The first and second points are defined based on adding a positive value of the single offset from the initial trained timing to create a first point for the two-point sampling and adding a negative value of the single offset to the initial trained timing to create a second point for the two-point sampling. The controller configured to determine a need to retrain the memory interface based on two-point sampling further comprises the controller being configured to compare the first point to a first limit, compare the second point to a second limit, and determine whether either of the first point or the second point is closer to the initial trained timing than the first limit or the second limit, respectively. The controller configured to trigger the retraining of the memory interface based on a determination that at least one of the two points fails the two-point sampling comprises the controller being configured to retrain the memory interface based on a determination that one of the first point or the second point being closer to the initial trained timing than the first limit or the second limit, respectively.

In some embodiments, the memory interface and the memory cell are embedded in a memory die. In some embodiments, the event comprises one or more of a process variation, a temperature variation, or a voltage variation in a signal tree associated with the trigger signal.

The above description describes the use of the controller 702 in relation to coordinating data operations with the memory cell structure 742. Such use of the systems and methods described herein may provide various benefits such as improved error detection capabilities over other embodiments. Such error detection capabilities may include capabilities to detect, for example, changes to tDQS2DQ signals, DQS/DQSB signal duty cycle variations, and/or DQ data signal duty cycle variations. In some embodiments, the systems and methods described herein may reduce training time for the memory interface 730 and/or the memory die 704. Furthermore, the systems and methods described herein do not need to introduce new components to the memory die, different from the embodiments using oscillator circuits.

Each of the processes, methods, and algorithms described in the preceding sections may be embodied in, and fully or partially automated by, code components executed by one or more computer systems or computer processors comprising computer hardware. The one or more computer systems or computer processors may also operate to support performance of the relevant operations in a "cloud computing" environment or as a "software as a service" (SaaS). The processes and algorithms may be implemented partially or wholly in application-specific circuitry. The various features and processes described above may be used independently of one another or may be combined in various ways. Different combinations and sub-combinations are intended to fall within the scope of this disclosure, and certain method or process blocks may be omitted in some implementations. The methods and processes described herein are also not limited to any particular sequence, and the blocks or states relating thereto can be performed in other sequences that are appropriate, or may be performed in parallel, or in some other manner. Blocks or states may be added to or removed from the disclosed example embodiments. The performance of certain of the operations or processes may be distributed among computer systems or computers processors, not only residing within a single machine, but deployed across a number of machines.

As used herein, a circuit might be implemented utilizing any form of hardware, software, or a combination thereof. For example, one or more processors, controllers, ASICs, PLAs, PALs, CPLDs, FPGAs, logical components, software routines or other mechanisms might be implemented to make up a circuit. In implementation, the various circuits described herein might be implemented as discrete circuits or the functions and features described can be shared in part or in total among one or more circuits. Even though various features or elements of functionality may be individually described or claimed as separate circuits, these features and functionality can be shared among one or more common circuits, and such description shall not require or imply that separate circuits are required to implement such features or functionality. Where a circuit is implemented in whole or in part using software, such software can be implemented to operate with a computing or processing system capable of carrying out the functionality described with respect thereto.

As used herein, the term "or" may be construed in either an inclusive or exclusive sense. Moreover, the description of resources, operations, or structures in the singular shall not be read to exclude the plural. Conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Terms and phrases used in this document, and variations thereof, unless otherwise expressly stated, should be construed as open ended as opposed to limiting. Adjectives such as "conventional," "traditional," "normal," "standard," "known," and terms of similar meaning should not be construed as limiting the item described to a given time period or to an item available as of a given time, but instead should be read to encompass conventional, traditional, normal, or standard technologies that may be available or known now or at any time in the future. The presence of broadening words and phrases such as "one or more," "at least," "but not limited to" or other like phrases in some instances shall not be read to mean that the narrower case is intended or required in instances where such broadening phrases may be absent.

What is claimed is:

1. A method comprising:
   training a memory interface to determine a trigger signal timing for a trigger signal in a data window formed by a data signal in a memory cell, wherein the trigger signal timing identifies an initial trained timing in the data window at which a setup portion and a hold portion of the data window are substantially equal in length when the trigger signal is received at the initial trained timing;
   identifying an event that shifts the trigger signal timing away from the initial trained timing;
   determining that at least one of two points defined about the initial trained timing fails a two-point sampling by:
      based on the two points, establishing a set of passing boundaries identifying signal timings at which the trigger signal results in unsuccessful data operations; and
      determining that at least one of the passing boundaries is within a threshold window from the initial trained timing of the trigger signal; and
   triggering a retraining of the memory interface based on the determination.

2. The method of claim 1, further comprising:
   establishing the threshold window by identifying a set of thresholds indicating a minimum timing limit and a maximum timing limit from the initial trained timing of the trigger signal.

3. The method of claim 2, wherein the determination that at least one of two points defined about the initial trained timing fails the two-point sampling further comprises:
   applying at least one offset to the initial trained timing of the trigger signal by defining a first point of the two points and a second point of the two points about the initial trained timing based on:
      adding a positive value of the at least one offset from the initial trained timing to create the first point for the two-point sampling; and
      adding a negative value of the at least one offset from the initial trained timing to create the second point for the two-point sampling;
   comparing the first point to the minimum timing limit;
   comparing the second point to the maximum timing limit; and
   determining that one or more of the first point and the second point is closer to the initial trained timing than the minimum timing limit or the maximum timing limit, respectively,
   wherein triggering the retraining of the memory interface based on a determination that at least one of the two points fails the two-point sampling comprises retraining the memory interface based on the determination that one or more of the first point and the second point is closer to the initial trained timing than the minimum timing limit or the maximum timing limit respectively.

4. The method of claim 1, wherein the memory interface and the memory cell are embedded in a memory die.

5. The method of claim 1, wherein the event comprises one or more of a process variation, a temperature variation, or a voltage variation in a signal tree associated with the trigger signal.

6. The method of claim 1, wherein data is stored in the memory cell according to the data signal via on an unmatched memory circuit.

7. The method of claim 1, wherein one or more of the initial trained timing and the retraining comprise write training.

8. A system comprising:
a memory interface;
a memory cell; and
a controller configured to perform one or more instructions to:
train the memory interface based on determining a trigger signal timing for a trigger signal in relation to a data window formed by a data signal in the memory cell, wherein the trigger signal timing identifies an initial trained timing in the data window at which a setup portion and a hold portion of the data window are substantially equal in length when the trigger signal is received at the initial trained timing;
identify an event that shifts the trigger signal timing away from the initial trained timing;
determine that at least one of two points defined about the initial trained timing fails a two-point sampling by:
based on the two points, establishing a set of passing boundaries identifying signal timings at which the trigger signal results in unsuccessful data operations; and
determining that at least one of the passing boundaries is within a threshold window from the initial trained timing of the trigger signal; and
trigger a retraining of the memory interface based on the determination.

9. The system of claim 8, wherein the controller is further configured to:
establishing the threshold window by identifying a set of minimum thresholds indicating a minimum timing limit and a maximum timing limit from the initial trained timing of the trigger signal.

10. The system of claim 9, wherein the determination that at least one of the two points defined by the initial trained timing fails the two-point sampling further comprises:
apply at least one offset to the initial trained timing of the trigger signal by defining a first point of the two points and a second point of the two points about the initial trained timing based on:
adding a positive value of the at least one offset from the initial trained timing to create the first point for the two-point sampling; and
adding a negative value of the at least one offset from the initial trained timing to create the second point for the two-point sampling;
compare the first point to the minimum timing limit;
compare the second point to the maximum timing limit; and
determine that one or more of the first point and the second point is closer to the initial trained timing than the minimum timing limit or the maximum timing limit, respectively,
wherein the controller is configured to trigger the retraining of the memory interface based on a determination that at least one of the two points fails the two-point sampling comprises retraining the memory interface based on the determination that one or more of the first point and the second point is closer to the initial trained timing than the minimum timing limit or the maximum timing limit, respectively.

11. The system of claim 8, wherein the memory interface and the memory cell are embedded in a memory die.

12. The system of claim 8, wherein the event comprises one or more of a process variation, a temperature variation, or a voltage variation in a signal tree associated with the trigger signal.

13. The system of claim 8, further comprising an unmatched memory circuit configured to store data in the memory cell according to the data signal.

14. The system of claim 8, wherein one or more of the initial trained timing and the retraining comprise write training.

15. A system comprising:
an unmatched memory circuit configured to store data in a memory cell according to a data signal; and
a memory interface configured to:
train the memory interface to coordinate data operations with the unmatched memory circuit and the data signal according to a trigger signal;
determine a trigger signal timing in a data window formed by the data signal, wherein the trigger signal timing identifies an initial trained timing in the data window at which a setup portion and a hold portion of the data window are substantially equal in length when the trigger signal is received at the initial trained timing;
detect that a process, a voltage, or a temperature (PVT) variation in a signal tree associated with the trigger signal for the memory cell exceeds a threshold variation;
detect an occurrence of a variation of one or more of a duty cycle of the trigger signal, a duty cycle of the data signal, and a delay value between the trigger signal and the data signal; and
trigger a retraining of the memory interface based on a determination that the detected variation changes the trigger signal timing from the initial trained timing.

16. The system of claim 15, wherein detecting an occurrence of a variation of one or more of a duty cycle of the trigger signal, a duty cycle of the data signal, and a delay value between the trigger signal and the data signal comprises:
determining a passing window for the trigger signal based on detecting unsuccessful trigger signals; and
comparing the passing window to a minimum threshold window that surrounds the initial trained timing.

17. The system of claim 16, wherein determining a passing window for the trigger signal based on detecting unsuccessful trigger signals comprises:
detecting a first point at which a data operation based on an advance trigger signal is unsuccessful; and
detecting a second point at which a data operation based on a delayed trigger signal is unsuccessful.

18. The system of claim 16, wherein triggering a retraining of the memory interface based on a determination that the detected variation changes the trigger signal timing from the initial trained timing comprises:
determining that at least a portion of the passing window is within the minimum threshold window; and
in response to determining that at least a portion of the passing window is within the minimum threshold window, triggering the retraining of the memory interface.

19. The system of claim 15, wherein one or more of training the memory interface and retraining the memory interface comprises write training.

20. The system of claim 15, wherein triggering the retraining of the memory interface is also based on detecting that the PVT variation exceed the threshold variation.

* * * * *